(12) United States Patent
Shibuya et al.

(10) Patent No.: US 9,330,804 B2
(45) Date of Patent: May 3, 2016

(54) METALLIC MATERIAL FOR ELECTRONIC COMPONENTS, AND CONNECTOR TERMINALS, CONNECTORS AND ELECTRONIC COMPONENTS USING SAME

(71) Applicant: JX NIPPON MINING & METALS CORPORATION, Tokyo (JP)

(72) Inventors: Yoshitaka Shibuya, Ibaraki (JP); Kazuhiko Fukamachi, Ibaraki (JP); Atsushi Kodama, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 46 days.

(21) Appl. No.: 14/387,115

(22) PCT Filed: Jan. 25, 2013

(86) PCT No.: PCT/JP2013/051633
§ 371 (c)(1),
(2) Date: Sep. 22, 2014

(87) PCT Pub. No.: WO2013/140850
PCT Pub. Date: Sep. 26, 2013

(65) Prior Publication Data
US 2015/0047879 A1  Feb. 19, 2015

(30) Foreign Application Priority Data

Mar. 23, 2012 (JP) ................................. 2012-068148
May 16, 2012 (JP) ................................. 2012-112634

(51) Int. Cl.
*H01R 13/03* (2006.01)
*H01B 1/02* (2006.01)
(Continued)

(52) U.S. Cl.
CPC *H01B 1/02* (2013.01); *B32B 15/01* (2013.01); *B32B 15/018* (2013.01); *C22C 5/04* (2013.01);
(Continued)

(58) Field of Classification Search
CPC .................................. H01B 1/02; H01B 5/14
USPC ........................................... 174/126.1, 126.2
See application file for complete search history.

(56) References Cited

U.S. PATENT DOCUMENTS 7,391,116 B2 * 6/2008 Chen .......................... C23C 2/02
257/635

FOREIGN PATENT DOCUMENTS

EP  2868776 A1  5/2015
JP  01-306574 A  12/1989
(Continued)

OTHER PUBLICATIONS

Supplementary European Search Report for Application No. EP13763959 dated Nov. 9, 2015.

(Continued)

*Primary Examiner* — Chau N Nguyen
(74) *Attorney, Agent, or Firm* — Drinker Biddle & Reath LLP

(57) ABSTRACT

The present invention provides a metallic material for electronic components having a low degree of whisker formation and a high durability, and connector terminals, connectors and electronic components using the metallic material. The metallic material for electronic components includes: a base material; on the base material, a lower layer constituted with one or two or more selected from the group consisting of Ni, Cr, Mn, Fe, Co and Cu; on the lower layer, an upper layer constituted with an alloy composed of one or both of Sn and In (constituent elements A) and one or two or more of Ag, Au, Pt, Pd, Ru, Rh, Os and Ir (constituent elements B), wherein the thickness of the lower layer is 0.05 μm or more; the thickness of the upper layer is 0.005 μm or more and 0.6 μm or less; and in the upper layer, the relation between the ratio, the constituent elements A/(the constituent elements A+the constituent elements B) [mass %] (hereinafter, referred to as the proportion of Sn+In) and the plating thickness [μm] is given by plating thickness ≤ 8.2×(proportion of Sn+In)$^{-0.66}$
[herein, (the proportion of Sn+In) ≥ 10 mass %].

19 Claims, 1 Drawing Sheet

(51) Int. Cl.

| | | |
|---|---|---|
| C23C 14/14 | (2006.01) | |
| C22C 5/04 | (2006.01) | |
| C22C 5/06 | (2006.01) | |
| C22C 13/00 | (2006.01) | |
| C22C 19/03 | (2006.01) | |
| C23C 28/02 | (2006.01) | |
| B32B 15/01 | (2006.01) | |
| H01R 4/58 | (2006.01) | |
| C23C 10/28 | (2006.01) | |
| C23C 10/60 | (2006.01) | |
| C23C 14/58 | (2006.01) | |
| H05K 1/09 | (2006.01) | |
| H05K 3/24 | (2006.01) | |

(52) U.S. Cl.
CPC . *C22C 5/06* (2013.01); *C22C 13/00* (2013.01); *C22C 19/03* (2013.01); *C23C 10/28* (2013.01); *C23C 10/60* (2013.01); *C23C 14/14* (2013.01); *C23C 14/58* (2013.01); *C23C 28/021* (2013.01); *H01R 4/58* (2013.01); *H01R 13/03* (2013.01); *H05K 1/09* (2013.01); *H05K 3/244* (2013.01); *Y10T 428/12681* (2015.01); *Y10T 428/12708* (2015.01); *Y10T 428/12715* (2015.01); *Y10T 428/12722* (2015.01)

(56) References Cited

FOREIGN PATENT DOCUMENTS

| | | |
|---|---|---|
| JP | 4-370613 A | 12/1992 |
| JP | 02-925986 B2 | 7/1999 |
| JP | 11-279792 A | 10/1999 |
| JP | 11-350189 A | 12/1999 |
| JP | 2001-53210 A | 2/2001 |
| JP | 2010-265540 A | 11/2010 |
| JP | 2012-36436 A | 2/2012 |
| TW | 200936806 A | 9/2009 |

* cited by examiner

METALLIC MATERIAL FOR ELECTRONIC COMPONENTS, AND CONNECTOR TERMINALS, CONNECTORS AND ELECTRONIC COMPONENTS USING SAME

TECHNICAL FIELD

The present invention relates to a metallic material for electronic components, and connector terminals, connectors and electronic components using the same.

BACKGROUND ART

In connectors as connecting components for electronic devices for consumer use and for vehicle use, materials are used in which base plating of Ni or Cu is applied to the surface of brass or phosphor bronze materials and Sn or Sn alloy plating is further applied to the base plating. Sn or Sn alloy plating is generally required to have properties such as low contact resistance and high solder wettability, and further, recently the reduction of the insertion force has also been required at the time of joining together a male terminal and a female terminal molded by press processing of plating materials. In the production process, on the plating surface, there occur sometimes whiskers, which are needle crystals, causing problems such as short circuiting, and hence such whiskers are also required to be suppressed satisfactorily.

In this regard, Patent Literature 1 discloses an electrical contact material including a contact base material, a ground layer composed of Ni or Co, or an alloy of both of Ni and Co and formed on the surface of the contact base material, and an Ag—Sn alloy layer formed on the surface of the ground layer, wherein the average concentration of Sn in the Ag—Sn alloy layer is less than 10 mass %, and the concentration of Sn in the Ag—Sn alloy layer is varied with a concentration gradient so as to increase from the interface with the ground layer toward the surface layer portion of the Ag—Sn alloy layer. According to Patent Literature 1, an electrical contact material excellent in wear resistance, corrosion resistance and processability is described, and the electrical contact material is described to be able to be produced with an extremely low cost.

Patent Literature 2 discloses a material for electric/electronic components wherein on the surface of a substrate having a surface composed of Cu or a Cu alloy, through the intermediary of an intermediate layer composed of a Ni layer or a Ni alloy layer, a surface layer composed of a Sn layer or a Sn alloy layer is formed, each of these layers containing an $Ag_3Sn$ ($\epsilon$ phase) compound and having a thickness of 0.5 to 20 µm. As described in Patent Literature 2, an object of the invention described in Patent Literature 2 is to provide a material for electrical/electronic components, wherein the surface layer is lower in melting point than Sn, excellent in solderability, and free from the occurrence of whisker; the joint strength of the junction formed after soldering is high and at the same time the temporal degradation of the joint strength at high temperatures is hardly caused, and hence the material is suitable for a lead material; even when the material is used in a high-temperature environment, the increase of the contact resistance is suppressed, the material does not cause the degradation of the connection reliability with the counterpart member, and hence the material is suitable as a contact material, the object also including the provision of a method for producing the above-described material, and the provision of electrical/electronic components using the above-described material.

CITATION LIST

Patent Literature

Patent Literature 1—Japanese Patent Laid-Open No. Hei 4-370613
Patent Literature 2—Japanese Patent Laid-Open No. Hei 11-350189

SUMMARY OF INVENTION

Technical Problem

However, the technique described in Patent Literature 1 has not revealed the relation to the recently required reduction of the insertion force and the relation to the occurrence and nonoccurrence of the whiskers. The average concentration of Sn in the Ag—Sn alloy layer is less than 10 mass %, and the proportion of Ag in the Ag—Sn alloy layer is considerably large, and hence the gas corrosion resistance against the gases such as chlorine gas, sulfurous acid gas and hydrogen sulfide is not sufficient.

The technique described in Patent Literature 2 adopts a surface layer composed of a Sn layer or a Sn alloy layer, each of these layers containing a $Ag_3Sn$ ($\epsilon$ phase) compound and having a thickness of 0.5 to 20 µm, and this thickness cannot sufficiently reduce the insertion force as it is also the case in Patent Literature 1. Moreover, the content of $Ag_3Sn$ ($\epsilon$ phase) in the surface layer composed of a Sn layer or a Sn alloy layer is described to be 0.5 to 5 mass % in terms of the content of Ag, the proportion of Sn in the surface layer composed of a Sn layer or a Sn alloy layer is large, the thickness of the surface layer composed of a Sn layer or a Sn alloy layer is thick, and hence a problem of the occurrence of whiskers remains unsolved.

As described above, the metallic materials for electronic components having a conventional Sn—Ag alloy/Ni base plating structure suffer from problems involving insertion/extraction performance and whiskers, find difficulties in achieving sufficiently satisfactory specifications with respect to durability (including, for example, heat resistance, gas corrosion resistance, high solder wettability and fine sliding wear resistance), and the reasons for such difficulties have not yet been clarified.

The present invention has been achieved in order to solve the above-described problems, and an object of the present invention is the provision of a metallic material for electronic components, having a low degree of insertion/extraction force (the low degree of insertion/extraction force means the low insertion force generated at the time of joining together an male terminal and a female terminal), a low degree of whisker formation, and a high durability, and the provision of connector terminals, connectors and electronic components using the material.

SOLUTION TO PROBLEM

The present inventors made a diligent study, and consequently have discovered that a metallic material for electronic components, provided with all of a low degree of insertion/extraction force, a low degree of whisker formation and a high durability can be prepared by disposing a lower layer and an upper layer in this order on a base material, and by using a predetermined metal for each of the lower and upper layers to form a layer having a predetermined thickness or a predetermined deposition amount and a predetermined composition.

The present invention perfected on the basis of the above-described findings is, in an aspect thereof, a metallic material for electronic components excellent in low degree of whisker formation, low degree of insertion/extraction force, fine sliding wear resistance and gas corrosion resistance, including a base material; on the base material, a lower layer constituted with one or two or more selected from the group consisting of Ni, Cr, Mn, Fe, Co and Cu; and on the lower layer, an upper layer constituted with an alloy of one or both of Sn and In (constituent elements A) and one or two or more selected from Ag, Au, Pt, Pd, Ru, Rh, Os and Ir (constituent elements B), wherein the thickness of the lower layer is 0.05 μm or more; the thickness of the upper layer is 0.005 μm or more and 0.6 μm or less; and in the upper layer, the relation between the constituent element(s) A/(the constituent element(s) A+the constituent element(s) B) [mass %] (hereinafter, referred to as the proportion of Sn+In) and the plating thickness [μm] is given by plating thickness≤8.2×(proportion of Sn+In)$^{-0.66}$
[here, (proportion of Sn+In)≥10 mass %].

In the present invention, the proportion of Sn+In [mass %] excludes 0 and 100 mass %.

The metallic material for electronic components of the present invention is, in another aspect thereof, a metallic material for electronic components excellent in low degree of whisker formation, low degree of insertion/extraction force, fine sliding wear resistance and gas corrosion resistance, including a base material; on the base material, a lower layer constituted with one or two or more selected from the group consisting of Ni, Cr, Mn, Fe, Co and Cu; and on the lower layer, an upper layer constituted with an alloy of one or both of Sn and In (constituent elements A) and one or two or more selected from Ag, Au, Pt, Pd, Ru, Rh, Os and Ir (constituent elements B), wherein the plating deposition amount of the lower layer is 0.03 mg/cm$^2$ or more; the plating deposition amount of the upper layer is 7 μg/cm$^2$ or more and 600 μg/cm$^2$ or less; and in the upper layer, the relation between the constituent element(s) A/(the constituent element(s) A+the constituent element(s) B) [mass %] (hereinafter, referred to as the proportion of Sn+In) and the plating deposition amount [μg/cm$^2$] is given by plating deposition amount≤8200×(proportion of Sn+In)$^{-0.66}$ [here, (proportion of Sn+In)≥10 mass %].

In the metallic material for electronic components of the present invention, in one embodiment thereof, the plating thickness of the upper layer is 0.05 μm or more.

In the metallic material for electronic components of the present invention, in another embodiment thereof, the plating deposition amount of the upper layer is 40 μg/cm$^2$ or more.

In the metallic material for electronic components of the present invention, in yet another embodiment thereof, the relation between the proportion of Sn+In [mass %] and the plating thickness [μm] of the upper layer is given by plating thickness≥0.03×$e^{0.015\times(proportion\ of\ Sn+In)}$.

In the metallic material for electronic components of the present invention, in yet another embodiment thereof, the relation between the proportion of Sn+In [mass %] and the plating deposition amount [μg/cm$^2$] of the upper layer is given by plating deposition amount≥27.8×$e^{0.017\times(proportion\ of\ Sn+In)}$.

In the metallic material for electronic components of the present invention, in yet another embodiment thereof, the upper layer is formed by the diffusion of the constituent element(s) A and the constituent element(s) B under the conditions that a film of the constituent element(s) B is formed on the lower layer and then a film of the constituent element(s) A is formed on the lower layer.

In the metallic material for electronic components of the present invention, in yet another embodiment thereof, the diffusion is performed by heat treatment.

In the metallic material for electronic components of the present invention, in yet another embodiment thereof, the constituent elements A in the upper layer is 50 mass % or more in terms of the total content of Sn and In, and the upper layer further includes one or two or more metals selected from the group consisting of As, Bi, Cd, Co, Cr, Cu, Fe, Mn, Mo, Ni, Pb, Sb, W and Zn, as the alloy components.

In the metallic material for electronic components of the present invention, in yet another embodiment thereof, the constituent elements B in the upper layer is 50 mass % or more in terms of the total content of Ag, Au, Pt, Pd, Ru, Rh, Os and Ir, and the upper layer further includes one or two or more metals selected from the group consisting of Bi, Cd, Co, Cu, Fe, In, Mn, Mo, Ni, Pb, Sb, Se, Sn, W, TI and Zn, as the alloy components.

In the metallic material for electronic components of the present invention, in yet another embodiment thereof, the alloy composition of the lower layer includes Ni, Cr, Mn, Fe, Co and Cu in the total amount of these of 50 mass % or more, and further includes one or two or more selected from the group consisting of B, P, Sn and Zn.

In the metallic material for electronic components of the present invention, in yet another embodiment thereof, the Vickers hardness measured from the surface of the upper layer is Hv 100 or more.

In the metallic material for electronic components of the present invention, in yet another embodiment thereof, the indentation hardness measured from the surface of the upper layer is 1000 MPa or more.

In the metallic material for electronic components of the present invention, in yet another embodiment thereof, the Vickers hardness measured from the surface of the upper layer is Hv 1000 or less.

In the metallic material for electronic components of the present invention, in yet another embodiment thereof, the indentation hardness measured from the surface of the upper layer is 10000 MPa or less.

In the metallic material for electronic components of the present invention, in yet another embodiment thereof, the arithmetic mean height (Ra) of the surface of the upper layer is 0.1 μm or less.

In the metallic material for electronic components of the present invention, in yet another embodiment thereof, the maximum height (Rz) of the surface of the upper layer is 1 μm or less.

In the metallic material for electronic components of the present invention, in yet another embodiment thereof, the reflection density of the surface of the upper layer is 0.3 or more.

In the metallic material for electronic components of the present invention, in yet another embodiment thereof, on the basis of a depth analysis performed by XPS (X-ray photoelectron spectroscopy), the position ($D_1$) indicating the highest value of the atomic concentration (at %) of Sn or In of the constituent elements A of the upper layer, the position ($D_2$) indicating the highest value of the concentration (at %) of Ag, Au, Pt, Pd, Ru, Rh, Os or Ir of the constituent elements B of the upper layer, and the position ($D_3$) indicating the highest value of the atomic concentration (at %) of Ni, Cr, Mn, Fe, Co or Cu of the lower layer are located in the order of $D_1$, $D_2$ and $D_3$ from the outermost surface.

In the metallic material for electronic components of the present invention, in yet another embodiment thereof, on the basis of a depth analysis performed by XPS (X-ray photoelectron spectroscopy), the depth is 50 nm or more at which the highest value of the atomic concentration (at %) of Sn or In of the constituent elements A of the upper layer and the highest value of the concentration (at %) of Ag, Au, Pt, Pd, Ru, Rh, Os or Ir of the constituent elements B of the upper layer are each 10 at % or more, and the atomic concentration (at %) of Ni, Cr, Mn, Fe, Co or Cu of the lower layer is 25 at % or more.

In the metallic material for electronic components of the present invention, in yet another embodiment thereof, on the basis of a depth analysis performed by XPS (X-ray photoelectron spectroscopy), in the range of 0.02 μm from the outermost surface, the atomic concentration (at %) ratio, the constituent elements A/(the constituent elements A+the constituent elements B) is 0.1 or more.

In the metallic material for electronic components of the present invention, in yet another embodiment thereof, the Vickers hardness of the cross section of the lower layer is Hv 300 or more.

In the metallic material for electronic components of the present invention, in yet another embodiment thereof, the indentation hardness of the cross section of the lower layer is 2500 MPa or more.

In the metallic material for electronic components of the present invention, in yet another embodiment thereof, the Vickers hardness of the cross section of the lower layer is Hv 1000 or less.

In the metallic material for electronic components of the present invention, in yet another embodiment thereof, the indentation hardness of the surface of the lower layer is 10000 MPa or less.

The present invention is, in yet another aspect thereof, a connector terminal using, in the contact portion thereof, the metallic material for electronic components of the present invention.

The present invention is, in yet another aspect thereof, a connector using the connector terminal of the present invention.

The present invention is, in yet another aspect thereof, an FFC terminal using, in the contact portion thereof, the metallic material for electronic components of the present invention.

The present invention is, in yet another aspect thereof, an FPC terminal using, in the contact portion thereof, the metallic material for electronic components of the present invention.

The present invention is, in yet another aspect thereof, an FFC using the FFC terminal of the present invention.

The present invention is, in yet another aspect thereof, an FPC using the FPC terminal of the present invention.

The present invention is, in yet another aspect thereof, an electronic component using, in the electrode thereof for external connection, the metallic material for electronic components of the present invention.

The present invention is, in yet another aspect thereof, an electronic component using the metallic material for electronic components of the present invention, in a push-in type terminal thereof for fixing a board connection portion to a board by pushing the board connection portion into a through hole formed in the board, wherein a female terminal connection portion and the board connection portion are provided respectively on one side and the other side of a mounting portion to be attached to a housing.

Advantageous Effects of Invention

According to the present invention, it is possible to provide a metallic material for electronic components having a low degree of insertion/extraction force, a low degree of whisker formation and a high durability, and connector terminals, connectors and electronic components using the metallic material.

DESCRIPTION OF EMBODIMENTS

Figure 1:
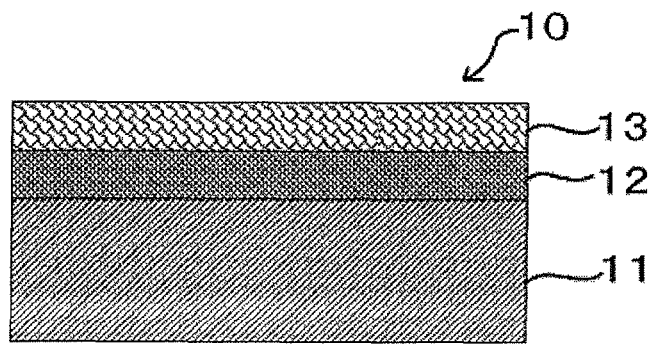
FIG. 1 is a schematic view illustrating the structure of the metallic material for electronic components according to one embodiment of the present invention.

Hereinafter, the metallic materials for electronic components according to the embodiments of the present invention are described. As shown in FIG. 1, the metallic material 10 for electronic components according to an embodiment includes a base material 11, an lower layer 12 formed on the surface of the base material 11, and an upper layer 13 formed on the lower layer 12.

Structure of Metallic Material for Electronic Components
  Base Material

Usable examples of the base material 11 include, without being particularly limited to: metal base materials such as copper and copper alloys, Fe-based materials, stainless steel, titanium and titanium alloys and aluminum and aluminum alloys. The base material 11 may be formed by combining a metal base material with a resin layer. Examples of the base material formed by combining a metal base material with a resin layer include the electrode portions in FPC and FFC base materials.

Upper Layer

The upper layer 13 is required to be constituted with an alloy composed of one or both of Sn and In (constituent elements A) and one or two or more of Ag, Au, Pt, Pd, Ru, Rh, Os and Ir (constituent elements B).

Sn and In are oxidizable metals, but are characterized by being relatively soft among metals. Accordingly, even when an oxide film is formed on the surface of Sn or In, for example at the time of joining together a male terminal and a female terminal by using a metallic material for electronic components as a contact material, the oxide film is easily scraped to result in contact between metals, and hence a low contact resistance is obtained.

Sn and In are excellent in the gas corrosion resistance against the gases such as chlorine gas, sulfurous acid gas and hydrogen sulfide gas; for example, when Ag poor in gas corrosion resistance is used for the upper layer 13, Ni poor in gas corrosion resistance is used for the lower layer 12, and copper or a copper alloy poor in gas corrosion resistance is used for the base material 11, Sn and In have an effect to improve the gas corrosion resistance of the metallic material for electronic components. As for Sn and in, Sn is preferable because In is severely regulated on the basis of the technical guidelines for the prevention of health impairment prescribed by the Ordinance of Ministry of Health, Labour and Welfare.

Ag, Au, Pt, Pd, Ru, Rh, Os and Ir are characterized by being relatively heat-resistant among metals. Accordingly, these metals suppress the diffusion of the composition of the base material 11 or the lower layer 12 toward the side of the upper layer 13 to improve the heat resistance. These metals also form compounds with Sn or In in the upper layer 13 to suppress the formation of the oxide film of Sn or In, so as to improve the solder wettability. Among Ag, Au, Pt, Pd, Ru, Rh, Os and Ir, Ag is more desirable from the viewpoint of electrical conductivity. Ag is high in electrical conductivity. For example, when Ag is used for high-frequency wave signals, impedance resistance is made low due to the skin effect.

The thickness of the upper layer 13 is required to be 0.005 µm or more and 0.6 µm or less. When the thickness of the upper layer 13 is less than 0.005 µm, the gas corrosion resistance is poor, and the exterior appearance of the upper layer 13 is discolored when a gas corrosion test is performed. Additionally, the fine sliding wear resistance is also poor, and the contact resistance is increased. On the other hand, when the thickness of the upper layer 13 exceeds 0.6 µm, the adhesive wear of Sn or In is significant, and the thin film lubrication effect due to the hard base material 11 or the lower layer is degraded to increase the insertion/extraction force and to cause whiskers to occur.

The deposition amount of the upper layer 13 is required to be 7 µg/cm² or more and 600 µg/cm² or less. Here, the reason for defining in terms of the deposition amount is described. For example, when the thickness of the upper layer 13 is measured with an X-ray fluorescent analysis thickness meter, sometimes errors occur in the value of the measured thickness, due to the alloy layer formed between the upper layer 13 and the lower layer 12. On the other hand, when the thickness is controlled by the deposition amount, a more accurate quality control can be performed independently of the formation state of the alloy layer.

When the deposition amount of the upper layer 13 is less than 7 µg/cm², the gas corrosion resistance is poor, and when a gas corrosion test is performed, the exterior appearance of the upper layer 13 is discolored. The fine sliding wear resistance is also poor to increase the contact resistance. On the other hand, when the deposition amount of the upper layer 13 exceeds 600 µg/cm², the adhesive wear of Sn or In is significant, and the thin film lubrication effect due to the hard base material 11 or the lower layer is degraded to increase the insertion/extraction force and to cause whiskers to occur.

In the upper layer, the relation between the constituent element(s) A/(the constituent element(s) A+the constituent element(s) B) [mass %] (hereinafter, referred to as the proportion of Sn+In) and the plating thickness [µm] is required to be given by $$\text{plating thickness} \leq 8.2 \times (\text{proportion of Sn+In})^{-0.66}$$
[here, (proportion of Sn+In)≥10 mass %].

When the plating thickness does not fall within this range, the insertion force is high to degrade the insertion/extraction performance, whiskers are caused to occur, the fine sliding wear resistance is also degraded and the gas corrosion resistance is also poor.

In the upper layer, the relation between the constituent element(s) A/(the constituent element(s) A+the constituent element(s) B) [mass %] (hereinafter, referred to as the proportion of Sn+In) and the plating deposition amount [µg/cm²] is required to be given by $$\text{plating deposition amount} \leq 8200 \times (\text{proportion of Sn+In})^{-0.66}$$
[here, (proportion of Sn+In)≥10 mass %].

When the plating deposition amount does not fall within this range, the insertion force is high to degrade the insertion/extraction performance, whiskers are caused to occur, the humidity resistance is also poor and the fine sliding wear resistance is also degraded.

The thickness of the upper layer 13 is preferably 0.05 µm or more. When the thickness of the upper layer 13 is less than 0.05 µm, sometimes the insertion/extraction resistance is poor, and repeated insertion/extraction operations sometimes scrape the upper layer to increase the contact resistance.

The deposition amount of the upper layer 13 is preferably 40 µg/cm² or more. When the deposition amount of the upper layer 13 is less than 40 µg/cm², sometimes the insertion/extraction resistance is poor, and repeated insertion/extraction operations sometimes scrape the upper layer to increase the contact resistance.

In the upper layer 13, the relation between the proportion of Sn+In [mass %] and the plating thickness [µm] is preferably given by $$\text{plating thickness} \geq 0.03 \times e^{0.015 \times (\text{proportion of Sn+In})}.$$

When the plating thickness does not fall within this range, sometimes the heat resistance and the solder wettability are poor.

In the upper layer 13, the relation between the proportion of Sn+In [mass %] and the plating deposition amount [µg/cm²] is preferably given by $$\text{plating deposition amount} \geq 27.8 \times e^{0.017 \times (\text{proportion of Sn+In})}.$$

When the plating deposition amount does not fall within this range, sometimes the heat resistance and the solder wettability are poor.

In the upper layer 13, the amount of the constituent elements A may be 50 mass % or more in terms of the total amount of Sn and In, and the residual alloy component may be composed of one or two or more metals selected from the group consisting of Ag, As, Au, Bi, Cd, Co, Cr, Cu, Fe, Mn, Mo, Ni, Pb, Sb, W and Zn. These metals sometimes further improve the low degree of insertion/extraction force, the low degree of whisker formation and the durability (including, for example, the heat resistance, gas corrosion resistance and solder wettability).

In the upper layer 13, the amount of the constituent elements B may be 50 mass % or more in terms of the total amount of Ag, Au, Pt, Pd, Ru, Rh, Os and Ir, and the residual alloy component may be composed of one or two or more metals selected from the group consisting of Bi, Cd, Co, Cu, Fe, In, Mn, Mo, Ni, Pb, Sb, Se, Sn, W, Tl and Zn. These metals sometimes further improve the low degree of insertion/extraction force, the low degree of whisker formation and the durability (including, for example, the heat resistance, gas corrosion resistance and solder wettability).

Lower Layer

Between the base material 11 and the upper layer 13, the lower layer 12 constituted with one or two or more selected from the group consisting of Ni, Cr, Mn, Fe, Co and Cu is required to be formed. The formation of the lower layer 12 by using one or two or more metals selected from the group consisting of Ni, Cr, Mn, Fe, Co and Cu improves the thin film lubrication effect through the formation of the hard lower layer and hence improves the low degree of insertion/extraction force, and the lower layer 12 prevents the diffusion of the constituent metals of the base material 11 into the upper layer 13, to improve the durability, for example, in such a way that the increase of the contact resistance and the degradation of the solder wettability after the heat resistance test or the gas corrosion resistance test are suppressed.

The thickness of the lower layer 12 is required to be 0.05 µm or more. When the thickness of the lower layer 12 is less than 0.05 µm, the thin film lubrication effect due to the hard lower layer is degraded to degrade the low degree of insertion/extraction force, the constituent metals of the base material 11 tend to diffuse into the upper layer 13, and sometimes the durability is degraded in such a way that the contact resistance is increased and the solder wettability tends to be degraded after the heat resistance test or the gas corrosion resistance test.

The deposition amount of Ni, Cr, Mn, Fe, Co and Cu in the lower layer 12 is required to be 0.03 mg/cm$^2$ or more. Here, the reason for defining in terms of the deposition amount is described. For example, when the thickness of the lower layer 12 is measured with an X-ray fluorescent analysis thickness meter, sometimes errors occur in the value of the measured thickness, due to the upper layer 13, the base material 11 and kike, and the formed alloy layer. On the other hand, when the thickness is controlled by the deposition amount, a more accurate quality control can be performed independently of the formation state of the alloy layer. When the deposition amount of Ni, Cr, Mn, Fe, Co and Cu in the lower layer 12 is less than 0.03 mg/cm$^2$, the thin film lubrication effect due to the hard lower layer is degraded to degrade the low degree of insertion/extraction force, the constituent metals of the base material 11 tend to diffuse into the upper layer 13, and sometimes the durability is degraded in such a way that the contact resistance is increased and the solder wettability tends to be degraded after the heat resistance test or the gas corrosion resistance test.

The alloy composition of the lower layer 12 includes Ni, Cr, Mn, Fe, Co and Cu in the total amount of these of 50 mass % or more, and may further include one or two or more selected from the group consisting of B, P, Sn and Zn. The alloy composition of the lower layer 12 having such a constitution as described above makes the lower layer harder and further improves the thin film lubrication effect to improve the low degree of insertion/extraction force; the alloying of the lower layer 12 further prevents the diffusion of the constituent metals of the base material 11 into the upper layer, and improves the durability in such a way that the increase of the contact resistance and the degradation of the solder wettability after the heat resistance test or the gas corrosion resistance test are suppressed.

Diffusion Treatment

The upper layer 13 may also be formed by the diffusion of the constituent element(s) A and the constituent element(s) B under the conditions that a film of the constituent element(s) B is formed on the lower layer 12 and then a film of the constituent element(s) A is formed on the lower layer. For example, when the constituent element A is Sn and the constituent element B is Ag, the diffusion of Ag into Sn, and thus, a Sn—Ag alloy layer is formed by spontaneous diffusion. The alloy layer formation makes the adhesion force of Sn further smaller to result in the low degree of insertion/extraction force, and also allows the low degree of whisker formation and the durability to be further improved.

Heat Treatment

After the formation of the upper layer 13, a heat treatment may be applied for the purpose of improving the low degree of insertion/extraction force, low degree of whisker formation, durability (including, for example, heat resistance, gas corrosion resistance and solder wettability). The heat treatment allows the constituent element(s) A and the constituent element(s) B of the upper layer 13 to form the alloy layer further easily, further reduces the adhesion force of Sn to result in low degree of insertion/extraction force, and can further improve the low degree of whisker formation and the durability. For the heat treatment, the treatment conditions (temperature× time) can be appropriately selected. The heat treatment is not particularly required to be applied.

Post-Treatment

To the upper layer 13, or to the upper layer 13 after being subjected to heat treatment, a post-treatment may be applied for the purpose of improving the low degree of insertion/extraction force or the durability (including, for example, heat resistance, gas corrosion resistance and solder wettability). The post-treatment improves the lubricity to result in further lower insertion/extraction force, and suppresses the oxidation of the upper layer 13 so as to be able to improve the durability including, for example, heat resistance, gas corrosion resistance and solder wettability. Specific examples of the post-treatment include phosphoric acid salt treatment, lubrication treatment and silane coupling treatment using an inhibitor. For the post-treatment, the treatment conditions (temperature×time) can be appropriately selected. The post-treatment is not particularly required to be applied.

Properties of Metallic Material for Electronic Components

The Vickers hardness measured from the surface of the upper layer 13 is preferably Hv 100 or more. The Vickers hardness of the surface of the upper layer 13 being Hv 100 or more improves the thin film lubrication effect through the hard upper layer, and consequently improves the low degree of insertion/extraction force. On the other hand, the Vickers hardness of the surface of the upper layer 13 surface (the value measured from the surface of the upper layer) is preferably Hv 1000 or less. The Vickers hardness of the surface of the upper layer 13 being Hv 1000 or less improves the bending processability, makes cracks hardly occur in the molded portion when the metallic material for electronic components of the present invention is subjected to press molding, and consequently suppresses the degradation of the gas corrosion resistance (durability).

The indentation hardness of the surface of the upper layer 13 is preferably 1000 MPa or more. The indentation hardness of the surface of the upper layer 13 being 1000 MPa or more improves the thin film lubrication effect through the hard upper layer, and consequently improves the low degree of insertion/extraction force. On the other hand the indentation hardness of the surface of the upper layer 13 is preferably 10000 MPa or less. The indentation Yhardness of the surface of the upper layer 13 being 10000 MPa or less improves the bending processability, makes cracks hardly occur in the molded portion when the metallic material for electronic components of the present invention is subjected to press molding, and consequently suppresses the degradation of the gas corrosion resistance (durability).

The arithmetic mean height (Ra) of the surface of the upper layer 13 is preferably 0.1 µm or less. The arithmetic mean height (Ra) of the surface of the upper layer 13 being 0.1 µm or less reduces the raised portions of the surface relatively tending to be corroded, thus smoothes the surface and improves the gas corrosion resistance.

The maximum height (Rz) of the surface of the upper layer 13 is preferably 1 µm or less. The maximum height (Rz) of the surface of the upper layer 13 being 1 µm or less reduces the raised portions relatively tending to be corroded, thus smoothes the surface and improves the gas corrosion resistance.

The reflection density of the surface of the upper layer 13 is preferably 0.3 or more. The reflection density of the surface of the upper layer 13 being 0.3 or more reduces the raised portions relatively tending to be corroded, thus smoothes the surface and improves the gas corrosion resistance.

The Vickers hardness of the lower layer 12 is preferably Hv 300 or more. The Vickers hardness of the lower layer 12 being Hv 300 or more makes the lower layer harder and further improves the thin film lubrication effect to improve the low degree of insertion/extraction force. On the other hand, the Vickers hardness of the lower layer 12 is preferably Hv 1000 or less. The Vickers hardness of the lower layer 12 being Hv 1000 or less improves the bending processability, makes cracks hardly occur in the molded portion when the metallic material for electronic components of the present invention is subjected to press molding, and consequently suppresses the degradation of the gas corrosion resistance (durability).

The indentation hardness of the lower layer 12 is preferably 2500 MPa or more. The indentation hardness of the lower layer 12 being 2500 MPa or more makes the lower layer harder and further improves the thin film lubrication effect to improve the low degree of insertion/extraction force. On the other hand, the indentation hardness of the lower layer 12 is preferably 10000 MPa or less. The indentation hardness of the lower layer 12 being 10000 MPa or less improves the bending processability, makes cracks hardly occur in the molded portion when the metallic material for electronic components of the present invention is subjected to press molding, and consequently suppresses the degradation of the gas corrosion resistance (durability).

On the basis of a depth analysis performed by XPS (X-ray photoelectron spectroscopy), the position ($D_1$) indicating the highest value of the atomic concentration (at %) of Sn or In of the constituent elements A of the upper layer 13, the position ($D_2$) indicating the highest value of the concentration (at %) of Ag, Au, Pt, Pd, Ru, Rh, Os or Ir of the constituent elements B of the upper layer 13, and the position ($D_3$) indicating the highest value of the atomic concentration (at %) of Ni, Cr, Mn, Fe, Co or Cu of the lower layer 12 are preferably located in the order of $D_1$, $D_2$ and $D_3$ from the outermost surface. When $D_1$, $D_2$ and $D_3$ are not located in this order, no sufficient gas corrosion resistance is obtained, and consequently when the metallic material for electronic components is subjected to a gas corrosion test with a gas such as chlorine gas, sulfurous acid gas and hydrogen sulfide gas, the metallic material for electronic components is corroded, and the contact resistance may be significantly increased as compared to the contact resistance before the gas corrosion test.

On the basis of a depth analysis performed by XPS (X-ray photoelectron spectroscopy), the depth is preferably 50 nm or more at which the highest value of the atomic concentration (at %) of Sn or In of the constituent elements A of the upper layer 13 and the highest value of the concentration (at %) of Ag, Au, Pt, Pd, Ru, Rh, Os or Ir of the constituent elements B of the upper layer 13 are each 10 at % or more, and the atomic concentration (at %) of Ni, Cr, Mn, Fe, Co or Cu of the lower layer 12 is 25 at % or more. When the depth is less than 50 nm at which the highest value of the atomic concentration (at %) of Sn or In of the constituent elements A of the upper layer 13 and the highest value of the atomic concentration (at %) of Ag, Au, Pt, Pd, Ru, Rh, Os or Ir of the constituent elements B of the upper layer 13 are each less than 10 at %, and the atomic concentration (at %) of Ni, Cr, Mn, Fe, Co or Cu of the lower layer 12 is 25 at % or more, the low degree of insertion/extraction force or the durability (including, for example, heat resistance, gas corrosion resistance and solder wettability) may be degraded by the diffusion of the components of the base material into the upper layer 13.

On the basis of a depth analysis performed by XPS (X-ray photoelectron spectroscopy), in the range of 0.02 μm from the outermost surface, the atomic concentration (at %) ratio, the constituent elements A/(the constituent elements A+the constituent elements B) is preferably 0.1 or more. In the case where the above-described ratio is less than 0.1, when the metallic material for electronic components is subjected to a gas corrosion test with a gas such as chlorine gas, sulfurous acid gas and hydrogen sulfide gas, the metallic material for electronic components is corroded and the exterior appearance of the material may be significantly discolored as compared to the exterior appearance before the gas corrosion test.

Applications of Metallic Material for Electronic Components

Examples of the application of the metallic material for electronic components of the present invention include, without being particularly limited to: a connector terminal using, in the contact portion thereof, the metallic material for electronic components, an FFC terminal or an FPC terminal using, in the contact portion thereof, the metallic material for electronic components, and an electronic component using, in the electrode thereof for external connection, the metallic material for electronic components. The terminal does not depend on the connection mode on the wiring side as exemplified by a crimp-type terminal, a soldering terminal and a press-fit terminal. Examples of the electrode for external connection include a connection component prepared by applying a surface treatment to a tab, and material surface treated for use in under bump metal of a semiconductor.

Connectors may also be prepared by using such connector terminals formed as described above, and an FFC or an FPC may also be prepared by using an FFC terminal or an FPC terminal.

The metallic material for electronic components of the present invention may also be used in a push-in type terminal for fixing a board connection portion to a board by pushing the board connection portion into the through hole formed in the board, wherein a female terminal connection portion and the board connection portion are provided respectively on one side and the other side of a mounting portion to be attached to a housing.

In a connector, both of the male terminal and the female terminal may be made of the metallic material for electronic components of the present invention, or only one of the male terminal and the female terminal may be made of the metallic material for electronic components of the present invention. The use of the metallic material for electronic components of the present invention for both of the male terminal and the female terminal further improves the low degree of insertion/extraction force.

Method for Producing Metallic Material for Electronic Components

As the method for producing the metallic material for electronic components of the present invention, for example, either a wet plating (electroplating or electroless plating) or a dry plating (sputtering or ion plating) can be used.

EXAMPLES

Hereinafter, Examples of the present invention are presented together with Comparative Examples; these Examples and Comparative Examples are provided for better understanding of the present invention, and are not intended to limit the present invention.

As Examples and Comparative Examples, the samples each formed by arranging a base material, a lower layer and an upper layer in this order and by heat treating the resulting arranged were prepared under the conditions shown in Tables 1 to 6 presented below.

Table 1 shows the preparation conditions of the base material, Table 2 shows the preparation conditions of the lower layer, Table 3 shows the preparation conditions of the upper layer and Table 4 shows the heat treatment conditions. Table 5 (Table 5-1, Table 5-2 and Table 5-3) shows the preparation conditions of the respective layers and the heat treatment conditions used in each of Examples, and Table 6 shows the preparation conditions of the respective layers and the heat treatment conditions used in each of Comparative Examples.

TABLE 1

| Shape | Thickness [mm] | Width [mm] | Component [mass %] | Temper |
|---|---|---|---|---|
| Plate | 0.30 | 30 | Cu—30Zn | H |
| Male material | 0.64 | 2.3 | | |

TABLE 2

| No. | Surface treatment method | Details |
|---|---|---|
| 1 | Electro-plating | Plating solution: Ni sulfamate plating solution<br>Plating temperature: 55° C.<br>Electric current density: 0.5 to 4 A/dm$^2$ |
| 2 | Electro-plating | Plating solution: Cu sulfate plating solution<br>Plating temperature: 30° C.<br>Electric current density: 2.3 A/dm$^2$ |
| 3 | Electro-plating | Plating solution: Chromium sulfate plating solution<br>Plating temperature: 30° C.<br>Electric current density: 4 A/dm$^2$ |
| 4 | Sputtering | Target: Target having a predetermined composition<br>Apparatus: Sputtering apparatus manufactured by ULVAC, Inc.<br>Output: DC 50 W<br>Argon pressure: 0.2 Pa |
| 5 | Electro-plating | Plating solution: Fe sulfate solution<br>Plating temperature: 30° C.<br>Electric current density: 4 A/dm$^2$ |
| 6 | Electro-plating | Plating solution: Co sulfate solution<br>Plating temperature: 30° C.<br>Electric current density: 4 A/dm$^2$ |
| 7 | Electro-plating | Plating solution: Ni sulfamate plating solution + saccharine<br>Plating temperature: 55° C.<br>Electric current density: 4 A/dm$^2$ |
| 8 | Electro-plating | Plating solution: Ni sulfamate plating solution + saccharine + additive(s)<br>Plating temperature: 55° C.<br>Electric current density: 4 A/dm$^2$ |

TABLE 3

| No. | Surface treatment method | Details |
|---|---|---|
| 1 | Sputtering | Target: Target having a predetermined composition<br>Apparatus: Sputtering apparatus manufactured by ULVAC, Inc.<br>Output: DC 50 W<br>Argon pressure: 0.2 Pa |
| 2 | Electro-plating | Ag plating → Sn plating<br>"Ag plating"<br>Plating solution: Ag cyanide plating solution<br>Plating temperature: 40° C.<br>Electric current density: 0.2 to 4 A/dm$^2$<br>"Sn plating"<br>Plating solution: Sn methanesulfonate plating solution<br>Plating temperature: 40° C.<br>Electric current density: 0.2 to 4 A/dm$^2$ |
| 3 | Electro-plating | Plating solution: Sn methanesulfonate plating solution<br>Plating temperature: 40° C.<br>Electric current density: 0.2 to 4 A/dm$^2$ |
| 4 | Electro-plating | Plating solution: Sn—Ag alloy plating solution<br>Plating temperature: 40° C.<br>Electric current density: 0.2 to 4 A/dm$^2$ |
| 5 | Electro-plating | Sn plating → Ag plating<br>"Ag plating"<br>Plating solution: Ag cyanide plating solution<br>Plating temperature: 40° C.<br>Electric current density: 0.2 to 4 A/dm$^2$<br>"Sn plating"<br>Plating solution: Sn methanesulfonate plating solution<br>Plating temperature: 40° C.<br>Electric current density: 0.2 to 4 A/dm$^2$ |

TABLE 4

| No. | Temperature [° C.] | Time [sec] |
|---|---|---|
| 1 | 300 | 3 |
| 2 | 300 | 5 |
| 3 | 500 | 18 |
| 4 | 600 | 30 |
| 5 | 600 | 4 |

TABLE 5-1

| Example No. | Upper layer Condition No. (see Table 3) | Lower layer Condition No. (see Table 2) | Heat treatment Condition No. (see Table 4) |
|---|---|---|---|
| 1 | 1 | 1 | 1 |
| 2 | 1 | 1 | 1 |
| 3 | 1 | 1 | 1 |
| 4 | 1 | 1 | 1 |
| 5 | 1 | 1 | 1 |
| 6 | 1 | 1 | 1 |
| 7 | 1 | 1 | 1 |
| 8 | 1 | 1 | 1 |
| 9 | 1 | 1 | 1 |
| 10 | 1 | 1 | 1 |
| 11 | 1 | 1 | 1 |
| 12 | 1 | 1 | 1 |
| 13 | 1 | 1 | 1 |
| 14 | 1 | 1 | 1 |
| 15 | 1 | 1 | 1 |
| 16 | 2 | 1 | 1 |
| 17 | 2 | 1 | — |
| 18 | 2 | 1 | — |
| 19 | 2 | 1 | 1 |
| 20 | 1 | 1 | 1 |
| 21 | 1 | 1 | 1 |
| 22 | 1 | 1 | 1 |
| 23 | 1 | 1 | 1 |
| 24 | 1 | 1 | 1 |
| 25 | 1 | 1 | 1 |
| 26 | 1 | 1 | 1 |
| 27 | 1 | 1 | 1 |
| 28 | 1 | 1 | 1 |
| 29 | 1 | 1 | 1 |
| 30 | 1 | 1 | 1 |
| 31 | 1 | 1 | 1 |
| 32 | 1 | 1 | 1 |
| 33 | 1 | 1 | 1 |
| 34 | 1 | 1 | 1 |
| 35 | 1 | 1 | 1 |
| 36 | 1 | 1 | 1 |
| 37 | 1 | 1 | 1 |
| 38 | 1 | 1 | 1 |
| 39 | 1 | 1 | 1 |
| 40 | 1 | 1 | 1 |
| 41 | 1 | 1 | 1 |

TABLE 5-2

| Example No. | Upper layer Condition No. (see Table 3) | Lower layer Condition No. (see Table 2) | Heat treatment Condition No. (see Table 4) |
|---|---|---|---|
| 42 | 1 | 1 | 1 |
| 43 | 1 | 1 | 1 |
| 44 | 1 | 1 | 1 |
| 45 | 1 | 1 | 1 |
| 46 | 1 | 1 | 1 |
| 47 | 1 | 1 | 1 |
| 48 | 1 | 1 | 1 |
| 49 | 1 | 1 | 1 |
| 50 | 1 | 1 | 1 |
| 51 | 1 | 1 | 1 |
| 52 | 1 | 1 | 1 |
| 53 | 1 | 1 | 1 |
| 54 | 1 | 1 | 1 |
| 55 | 1 | 1 | 1 |
| 56 | 1 | 1 | 1 |
| 57 | 1 | 1 | 1 |
| 58 | 1 | 1 | 1 |
| 59 | 1 | 3 | 1 |
| 60 | 1 | 4 | 1 |
| 61 | 1 | 5 | 1 |
| 62 | 1 | 6 | 1 |
| 63 | 1 | 2 | 1 |
| 64 | 1 | 1 | 1 |
| 65 | 1 | 1 | 1 |
| 66 | 1 | 1 | 1 |
| 67 | 1 | 1 | 1 |
| 68 | 1 | 1 | 1 |
| 69 | 1 | 1 | 1 |
| 70 | 1 | 1 | 1 |
| 71 | 1 | 1 | 1 |
| 72 | 1 | 1 | 1 |
| 73 | 2 | 1 | — |
| 74 | 2 | 7 | — |
| 75 | 2 | 8 | — |
| 76 | 2 | 4 | — |
| 77 | 2 | 1 | — |
| 78 | 2 | 1 | — |
| 79 | 2 | 1 | — |
| 80 | 2 | 1 | — |
| 81 | 2 | 1 | — |

TABLE 5-3

| Example No. | Upper layer Condition No. (see Table 3) | Lower layer (C layer) Condition No. (see Table 2) | Heat treatment Condition No. (see Table 4) |
|---|---|---|---|
| 82 | 2 | 1 | — |
| 83 | 2 | 1 | — |
| 84 | 2 | 7 | — |
| 85 | 2 | 8 | — |
| 86 | 2 | 4 | — |
| 87 | 1 | 1 | 1 |
| 88 | 1 | 1 | 1 |
| 89 | 1 | 1 | 1 |

TABLE 6

| Comparative Example No. | Upper layer Condition No. (see Table 3) | Lower layer Condition No. (see Table 2) | Heat treatment Condition No. (see Table 4) |
|---|---|---|---|
| 1 | 3 | 1 | 2 |
| 2 | 3 | 1 | 2 |
| 3 | 3 | 1 | — |
| 4 | 3 | 2 | 2 |
| 5 | 3 | 1 | 2 |
| 6 | 2 | 1 | 3 |
| 7 | 2 | 1 | 4 |
| 8 | 4 | 1 | 5 |
| 9 | 1 | — | 1 |
| 10 | — | 1 | — |
| 11 | 1 | 1 | 1 |
| 12 | 1 | 1 | 1 |
| 13 | 1 | 1 | 1 |
| 14 | 1 | 1 | 1 |
| 15 | 1 | 1 | 1 |
| 16 | 1 | 1 | 1 |
| 17 | 2 | 1 | — |
| 18 | 5 | 1 | — |
| 19 | 3 | 1 | — |
| 20 | 2 | 1 | — |
| 21 | 2 | 1 | 4 |
| 22 | 2 | 1 | 5 |

Measurement of Thickness

The thickness of the upper layer and the thickness of the lower layer were determined by using the samples prepared by surface treating base materials containing no elements of the upper and lower layer, respectively, and by actually measuring the thickness of each of the samples with an X-ray fluorescent analysis thickness meter (SEA5100, manufactured by Seiko Instruments Inc., collimator: 0.1 mmΦ). For example, because in the case of Sn plating, if the base material was made of Cu-10 mass % Sn-0.15 mass % P, the base material contained Sn, and no accurate thickness of the Sn plating was able to be found, the thickness was measured with a sample prepared by using a base material made of Cu-30 mass % Zn, which did not contain Sn.

Measurement of Deposition Amount

Each of the samples was decomposed with an acid such as sulfuric acid or nitric acid, the deposition amounts of the respective metals were measured by ICP (inductively-coupled plasma) emission spectroscopic analysis. The specifically used acids are different depending on the compositions of the respective samples.

Determination of Composition

On the basis of the measured deposition amounts, respective metallic compositions were calculated.

Determination of Layer Structure

The layer structure of each of the obtained samples was determined on the basis of the depth profile obtained by XPS (X-ray photoelectron spectroscopy) analysis. The analyzed elements are the elements in the compositions of the upper layer and the lower layer, and C and O. These elements are defined as the specified elements. The total amount of the specified elements was taken as 100%, and the concentrations (at %) of the respective elements were analyzed. The thickness based on the XPS (X-ray photoelectron spectroscopy) corresponds to the distance (distance in terms of $SiO_2$) on the abscissa of the chart based on the analysis.

The surface of each of the obtained samples was also qualitatively analyzed by the survey measurement based on XPS (X-ray photoelectron spectroscopy). The resolution of the concentration in the qualitative analysis was set at 0.1 at %.

As the XPS apparatus, 5600MC manufactured by Ulvac-Phi, Inc. was used, under the following conditions: ultimate vacuum: $5.7 \times 10^{-9}$ Torr, excitation source: monochromatized AlKα, output power: 210 W, detection area: 800 μmΦ, incident angle: 45 degrees, take-off angle: 45 degrees, neutralization gun: not used; measurement was performed under the following sputtering conditions:

Ion species: $Ar^+$

Acceleration voltage: 3 kV

Scanning area: 3 mm×3 mm

Rate: 2.8 nm/min. (in terms of $SiO_2$)

Evaluations

For each of the samples, the following evaluations were performed.

A. Insertion/Extraction Force

The insertion/extraction force was evaluated by performing an insertion/extraction test for each of the plated male terminals according to Examples and Comparative Examples by using a commercially available Sn reflow plating female terminal (090 type Sumitomo TS/Yazaki 090II Series female terminal, non-waterproofing/F090-SMTS).

The measurement apparatus used in the test was the 1311NR manufactured by Aikoh Engineering Co., Ltd., and the evaluation was performed with a sliding distance of a male pin of 5 mm. The number of the samples was set at five, and because the insertion force and the extraction force were equivalent, a value obtained by averaging the maximum insertion forces of the respective samples was adopted as the insertion/extraction force. As the blank material of the insertion/extraction force, the sample of Comparative Example 1 was adopted.

The intended target of the insertion/extraction force is less than 85% of the maximum insertion/extraction force of Comparative Example 1. This is because the insertion/extraction force of Comparative Example 2 was 90% of the maximum insertion force of Comparative Example 1, and a larger reduction of the insertion/extraction force than the reduction of the insertion/extraction force in Comparative Example 2 was adopted as the intended target.

B. Whiskers

Whiskers were evaluated by the load test (ball indenter method) of JEITA RC-5241. Specifically, each of the samples was subjected to the load test, and each of the samples subjected to the load test was observed with a SEM (model JSM-5410, manufactured by JEOL Ltd.) at a magnification of 100× to 10000×, and thus the occurrence state of the whiskers was observed. The load test conditions are shown below.

Diameter of ball indenter: Φ 1 mm±0.1 mm

Test load: 2 N±0.2 N

Test time: 120 hours

Number of samples: 10

The intended property was such that no whiskers 20 μm or more in length occurred, and the biggest intended target was such that no whiskers occurred.

C. Contact Resistance

The contact resistance was measured with the contact simulator model CRS-113-Au manufactured by Yamasaki-seiki Co., Ltd., under the condition of the contact load of 50 kg, on the basis of the four-terminal method. The number of the samples was set at five, and the range from the minimum value to the maximum value of each of the samples was adopted. The intended target was the contact resistance of 10 mΩ or less.

D. Heat Resistance

The heat resistance was evaluated by measuring the contact resistance of a sample after an atmospheric heating (155° C.×1000 h). The intended property was the contact resistance of 10 mΩ or less, and the biggest target was such that the contact resistance was free from variation (equal) between before and after the heat resistance test.

E. Insertion/Extraction Performance

Insertion/extraction test was performed ten times on the basis of the method for the insertion force, and the insertion/extraction performance was evaluated by the contact resistance after the insertion/extraction test. The intended property was such that the contact resistance was 10 mΩ or less.

F. Fine Sliding Wear Resistance

The fine sliding wear resistance was evaluated in terms of the relation between the number of the sliding operations and the contact resistance by using the fine sliding tester model CRS-G2050 manufactured by Yamasaki-seiki Co., Ltd., under the conditions of a sliding distance of 0.5 mm, a sliding speed of 1 mm/s, a contact load of 1 N, and a number of the back and forth sliding operations of 500. The number of the samples was set at five, and the range from the minimum value to the maximum value of each of the samples was adopted. The intended property was such that the contact resistance was 50 mΩ or less at the time of the number of sliding operations of 100.

G. Gas Corrosion Resistance

The gas corrosion resistance was evaluated in the following test environment. The evaluation of the gas corrosion resistance was based on the exterior appearance and the contact resistance of each of the samples after the completion of an environmental test. The intended property was such that the exterior appearance was hardly discolored and the contact resistance after the test was 10 mΩ or less.

Hydrogen Sulfide Gas Corrosion Test

Hydrogen sulfide concentration: 10 ppm

Temperature: 40° C.

Humidity: 80% RH

Exposure time: 96 h

Number of samples: 5

H. Solder Wettability

The solder wettability was evaluated for the samples after plating. A solder checker (SAT-5000, manufactured by Rhesca Corp.) was used, a commercially available 25% rosin-methanol flux was used as a flux, and the solder wetting time was measured by a meniscograph method. A solder Sn-3Ag-0.5Cu (250° C.) was used. The number of the samples was set at five, and the range from the minimum value to the maximum value of each of the samples was adopted. The intended property was such that the zero cross time was 5 seconds (s) or less.

I. Bending Processability

The bending processability was evaluated by using a W-shaped mold on the basis of the 90° bending under the condition that the ratio between the plate thickness of each of the samples and the bending radius was 1. The evaluation was performed as follows: the surface of the bending-processed portion of each of the samples was observed with an optical microscope, and the case where no cracks were observed and practically no problems were determined to be involved was marked with ○, and the case where crack(s) was found was marked with x.

J. Vickers Hardness

The Vickers hardness of the upper layer was measured by pressing an indenter from the surface of each of the samples with a load of 980.7 mN (Hv 0.1) and a load retention time of 15 seconds.

The Vickers hardness of the lower layer was measured by pressing an indenter from the cross section of the lower layer of each of the samples with a load of 980.7 mN (Hv 0.1) and a load retention time of 15 seconds.

K. Indentation Hardness

The indentation hardness of the upper layer was measured with a nanoindentation hardness tester (ENT-2100, manufactured by Elionix Inc.) by pressing an indenter onto the surface of each of the samples with a load of 0.1 mN.

The indentation hardness of the lower layer was measured by pressing an indenter from the cross section of the lower layer of each of the samples with a load of 980.7 mN (Hv 0.1) and a load retention time of 15 seconds.

L. Surface Roughness

The measurement of the surface roughness (the arithmetic mean height (Ra) and the maximum height (Rz)) was performed according to JIS B 0601, by using a noncontact three-dimensional measurement apparatus (model NH-3, manufactured by Mitaka Kohki Co., Ltd.). The cutoff was 0.25 mm, the measurement length was 1.50 mm, and the measurement was repeated five times for one sample.

M. Reflection Density

The reflection density of each of the samples was measured by using a densitometer (ND-1, manufactured by Nippon Denshoku Industries Co., Ltd.).

TABLE 7-1

| | | | Upper layer | | | |
|---|---|---|---|---|---|---|
| | | Composition | Thickness [μm] | Deposition amount [μg/cm²] | Relation between thickness and proportion of Sn + In [mass %] | Relation between deposition amount and proportion of Sn + In [mass %] | Formation method |
| Examples | 1 | Sn40—Ag | 0.01 | 9 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 2 | Sn20—Ag | 0.55 | 542 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 3 | Sn40—Ag | 0.55 | 507 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 4 | Sn60—Ag | 0.50 | 428 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 5 | Sn80—Ag | 0.40 | 317 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 6 | Sn40—Ag | 0.55 | 471 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 7 | Sn40—Ag | 0.27 | 231 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 8 | In40—Ag | 0.27 | 231 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 9 | Sn40—Au | 0.27 | 326 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 10 | Sn40—Pt | 0.27 | 349 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 11 | Sn40—Pd | 0.27 | 249 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 12 | Sn40—Ru | 0.27 | 248 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 13 | Sn40—Rh | 0.27 | 252 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 14 | Sn40—Os | 0.27 | 356 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 15 | Sn40—Ir | 0.27 | 356 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| | 16 | Sn26—Ag | 0.15 | 145 | Plating thickness ≤ 8.2 × (proportion of Sn + In)$^{-0.66}$ | Plating deposition amount ≤ 8200 × (proportion of Sn + In)$^{-0.66}$ | 0.1-μm Ag plating followed by 0.05-μm Sn plating on Ag |
| | 17 | Sn26—Ag | 0.15 | 145 | Plating thickness ≤ 8.2 × (proportion of Sn + In)$^{-0.66}$ | Plating deposition amount ≤ 8200 × (proportion of Sn + In)$^{-0.66}$ | 0.1-μm Ag plating followed by 0.05-μm Sn plating on Ag |
| | 18 | Sn41—Ag | 0.06 | 55 | Plating thickness ≤ 8.2 × (proportion of Sn + In)$^{-0.66}$ | Plating deposition amount ≤ 8200 × (proportion of Sn + In)$^{-0.66}$ | 0.03-μm Ag plating followed by 0.03-μm Sn plating on Ag |
| | 19 | Sn26—Ag | 0.30 | 275 | Plating thickness ≤ 8.2 × (proportion of Sn + In)$^{-0.66}$ | Plating deposition amount ≤ 8200 × (proportion of Sn + In)$^{-0.66}$ | 0.2-μm Ag plating followed by 0.1-μm Sn plating on Ag |
| | 20 | Sn15—Ag | 0.30 | 275 | Plating thickness ≤ 8.2 × (proportion of Sn + In)$^{-0.66}$ | Plating deposition amount ≤ 8200 × (proportion of Sn + In)$^{-0.66}$ | Sputtering of alloy having predetermined composition |
| Targets | | | 0.005 ≤ ≤ 0.6 | 7 ≤ ≤ 600 | Plating thickness ≤ 8.2 × (proportion of Sn + In)$^{-0.66}$ | Plating deposition amount ≤ 8200 × (proportion of Sn + In)$^{-0.66}$ | |

*Sn60—Ag means 60 mass % of Sn and 40 mass % of Ag

TABLE 7-2

| | | Composition | Upper layer Thickness [μm] | Deposition amount [μg/cm²] | Relation between thickness and proportion of Sn + In [mass %] | Relation between deposition amount and proportion of Sn + In [mass %] | Formation method |
|---|---|---|---|---|---|---|---|
| Comparative Examples | 1 | Sn | 1.0 | 728 | | | Sn plating |
| | 2 | Sn | 0.6 | 437 | | | Sn plating |
| | 3 | Sn | 0.6 | 437 | | | Sn plating |
| | 4 | Sn | 1.0 | 728 | | | Sn plating |
| | 5 | Sn | 1.0 | 728 | | | Sn plating |
| | 6 | Sn8—Ag | 0.56 | 408 | | | 0.5-μm Ag plating followed by 0.06-μm Sn plating on Ag |
| | 7 | Sn3—Ag | 1.05 | 1092 | | | 1.0-μm Ag plating followed by 0.05-μm Sn plating on Ag |
| | 8 | Sn96—Ag | 0.6 | 445 | Plating thickness > 8.2 × (proportion of Sn + In)$^{-0.66}$ | Plating deposition amount > 8200 × (proportion of Sn + In)$^{-0.66}$ | Sn—Ag alloy plating |
| | 9 | Sn40—Ag | 0.55 | 471 | | | Sputtering of alloy having predetermined composition |
| | 10 | | | | | | |
| | 11 | Sn40—Ag | 0.55 | 471 | | | Sputtering of alloy having predetermined composition |
| | 12 | Sn40—Ag | 0.003 | 3 | | | Sputtering of alloy having predetermined composition |
| | 13 | Sn20—Ag | 0.80 | 788 | Plating thickness > 8.2 × (proportion of Sn + In)$^{-0.66}$ | Plating deposition amount > 8200 × (proportion of Sn + In)$^{-0.66}$ | Sputtering of alloy having predetermined composition |
| | 14 | Sn40—Ag | 0.80 | 737 | Plating thickness > 8.2 × (proportion of Sn + In)$^{-0.66}$ | Plating deposition amount > 8200 × (proportion of Sn + In)$^{-0.66}$ | Sputtering of alloy having predetermined composition |
| | 15 | Sn60—Ag | 0.60 | 514 | Plating thickness > 8.2 × (proportion of Sn + In)$^{-0.66}$ | Plating deposition amount > 8200 × (proportion of Sn + In)$^{-0.66}$ | Sputtering of alloy having predetermined composition |
| | 16 | Sn80—Ag | 0.50 | 396 | Plating thickness > 8.2 × (proportion of Sn + In)$^{-0.66}$ | Plating deposition amount > 8200 × (proportion of Sn + In)$^{-0.66}$ | Sputtering of alloy having predetermined composition |
| Targets | | | 0.005 ≤ ≤ 0.6 | 7 ≤ ≤ 600 | Plating thickness ≤ 8.2 × (proportion of Sn + In)$^{-0.66}$ | Plating deposition amount ≤ 8200 × (proportion of Sn + In)$^{-0.66}$ | |

*Sn60—Ag means 60 mass % of Sn and 40 mass % of Ag.

TABLE 7-3

| | | Lower layer | | | | Whiskers | | Insertion/extraction force Maximum insertion force/maximum insertion force of Comparative Example 1 [%] | Fine sliding wear resistance Contact resistance [mΩ] | Gas corrosion resistance | |
|---|---|---|---|---|---|---|---|---|---|---|---|
| | | Composition | Thickness [μm] | Deposition amount [mg/cm²] | Heat treatment Conditions | Number of whiskers less than 20 μm in length [pieces] | Number of whiskers of 20 μm or more in length [pieces] | | | Exterior appearance after test | Contact resistance [mΩ] |
| Examples | 1 | Ni | 1.0 | 0.9 | 300° C. × 3 sec | 0 | 0 | 69 | 1 to 50 | Not discolored | 2 to 5 |
| | 2 | Ni | 1.0 | 0.9 | 300° C. × 3 sec | 0 | 0 | 79 | 1 to 50 | Not discolored | 2 to 5 |
| | 3 | Ni | 1.0 | 0.9 | 300° C. × 3 sec | 0 | 0 | 78 | 1 to 50 | Not discolored | 2 to 5 |
| | 4 | Ni | 1.0 | 0.9 | 300° C. × 3 sec | 0 | 0 | 76 | 1 to 50 | Not discolored | 2 to 5 |
| | 5 | Ni | 1.0 | 0.9 | 300° C. × 3 sec | 0 | 0 | 77 | 1 to 50 | Not discolored | 2 to 5 |
| | 6 | Ni | 0.1 | 0.1 | 300° C. × 3 sec | 0 | 0 | 80 | 1 to 50 | Not discolored | 2 to 5 |
| | 7 | Ni | 1.0 | 0.9 | 300° C. × 3 sec | 0 | 0 | 75 | 1 to 50 | Not discolored | 2 to 5 |

TABLE 7-3-continued

| | | Lower layer | | | Whiskers | | Insertion/extraction force Maximum insertion force/maximum insertion force of Comparative Example 1 [%] | Fine sliding wear resistance Contact resistance [mΩ] | Gas corrosion resistance | |
|---|---|---|---|---|---|---|---|---|---|---|
| | | Composition | Thickness [μm] | Deposition amount [mg/cm²] | Heat treatment Conditions | Number of whiskers less than 20 μm in length [pieces] | Number of whiskers of 20 μm or more in length [pieces] | | | Exterior appearance after test | Contact resistance [mΩ] |
| | 8 | Ni | 1.0 | 0.9 | 300° C. × 3 sec | 0 | 0 | 76 | 1 to 50 | Not discolored | 2 to 5 |
| | 9 | Ni | 1.0 | 0.9 | 300° C. × 3 sec | 0 | 0 | 74 | 1 to 50 | Not discolored | 2 to 5 |
| | 10 | Ni | 1.0 | 0.9 | 300° C. × 3 sec | 0 | 0 | 72 | 1 to 50 | Not discolored | 2 to 5 |
| | 11 | Ni | 1.0 | 0.9 | 300° C. × 3 sec | 0 | 0 | 73 | 1 to 50 | Not discolored | 2 to 5 |
| | 12 | Ni | 1.0 | 0.9 | 300° C. × 3 sec | 0 | 0 | 76 | 1 to 50 | Not discolored | 2 to 5 |
| | 13 | Ni | 1.0 | 0.9 | 300° C. × 3 sec | 0 | 0 | 72 | 1 to 50 | Not discolored | 2 to 5 |
| | 14 | Ni | 1.0 | 0.9 | 300° C. × 3 sec | 0 | 0 | 74 | 1 to 50 | Not discolored | 2 to 5 |
| | 15 | Ni | 1.0 | 0.9 | 300° C. × 3 sec | 0 | 0 | 76 | 1 to 50 | Not discolored | 2 to 5 |
| | 16 | Ni | 1.0 | 0.9 | 300° C. × 3 sec | 0 | 0 | 75 | 1 to 50 | Not discolored | 2 to 5 |
| | 17 | Ni | 1.0 | 0.9 | None | 0 | 0 | 79 | 1 to 50 | Not discolored | 2 to 5 |
| | 18 | Ni | 1.0 | 0.9 | None | 0 | 0 | 72 | 1 to 50 | Not discolored | 2 to 5 |
| | 19 | Ni | 1.0 | 0.9 | 300° C. × 3 sec | 0 | 0 | 70 | 1 to 50 | Not discolored | 2 to 5 |
| | 20 | Ni | 1.0 | 0.9 | 300° C. × 3 sec | 0 | 0 | 73 | 1 to 50 | Not discolored | 4 to 8 |
| Comparative Examples | 1 | Ni | 0.5 | 0.4 | 300° C. × 5 sec | — | ≤3 | 100 | 200< | Not discolored | 2 to 5 |
| | 2 | Ni | 0.5 | 0.4 | 300° C. × 5 sec | — | ≤2 | 90 | 200< | Not discolored | 2 to 5 |
| | 3 | Ni | 0.5 | 0.4 | | — | ≤2 | 90 | 200< | Not discolored | 2 to 5 |
| | 4 | Cu | 0.5 | 0.4 | 300° C. × 5 sec | — | ≤3 | 100 | 200< | Not discolored | 2 to 5 |
| | 5 | Ni | 1.0 | 0.9 | 300° C. × 5 sec | — | ≤3 | 100 | 200< | Not discolored | 2 to 5 |
| | 6 | Ni | 0.5 | 0.4 | 500° C. × 18 sec | — | — | — | — | Discolored | 10< |
| | 7 | Ni | 0.5 | 0.4 | 600° C. × 30 sec | — | — | — | — | Discolored | 10< |
| | 8 | Ni | 0.5 | 0.4 | 600° C. × 4 sec | — | ≤2 | 91 | — | — | — |
| | 9 | | | | 300° C. × 3 sec | 0 | 0 | 88 | — | — | — |
| | 10 | Ni | 1.0 | 0.9 | None | — | — | — | 200< | Discolored | 10< |
| | 11 | Ni | 0.01 | 0.01 | 300° C. × 3 sec | 0 | 0 | 87 | — | — | — |
| | 12 | Ni | 1.0 | 0.9 | 300° C. × 3 sec | — | — | — | 200< | Discolored | 10< |
| | 13 | Ni | 1.0 | 0.9 | 300° C. × 3 sec | ≤3 | ≤1 | 87 | — | — | — |
| | 14 | Ni | 1.0 | 0.9 | 300° C. × 3 sec | ≤3 | ≤1 | 88 | — | — | — |
| | 15 | Ni | 1.0 | 0.9 | 300° C. × 3 sec | ≤3 | ≤1 | 88 | 50 to 100 | — | — |
| | 16 | Ni | 1.0 | 0.9 | 300° C. × 3 sec | ≤3 | ≤1 | 86 | 50 to 100 | — | — |
| Targets | | | 0.005≤ | 0.03≤ | | | 0 | <85 | 1 to 50 | Not discolored | <10 |

TABLE 8

| | | Upper layer | | | | Lower layer | | | | Insertion/extraction performance |
|---|---|---|---|---|---|---|---|---|---|---|
| | | Composition | Thickness [μm] | Deposition amount [μg/cm²] | Formation method | Composition | Thickness [μm] | Deposition amount [mg/cm²] | Heat treatment Conditions | Contact resistance [mΩ] |
| Examples | 21 | Sn20—Ag | 0.03 | 30 | Sputtering of alloy having predetermined composition | Ni | 1.0 | 0.9 | 300° C. × 3 sec | 3 to 9 |

TABLE 8-continued

| | Upper layer | | | | Lower layer | | | | Insertion/extraction performance |
| --- | --- | --- | --- | --- | --- | --- | --- | --- | --- |
| | Composition | Thickness [μm] | Deposition amount [μg/cm$^2$] | Formation method | Composition | Thickness [μm] | Deposition amount [mg/cm$^2$] | Heat treatment Conditions | Contact resistance[mΩ] |
| 22 | Sn40—Ag | 0.03 | 28 | Sputtering of alloy having predetermined composition | Ni | 1.0 | 0.9 | 300° C. × 3 sec | 3 to 9 |
| 23 | Sn60—Ag | 0.03 | 26 | Sputtering of alloy having predetermined composition | Ni | 1.0 | 0.9 | 300° C. × 3 sec | 3 to 9 |
| 24 | Sn80—Ag | 0.03 | 24 | Sputtering of alloy having predetermined composition | Ni | 1.0 | 0.9 | 300° C. × 3 sec | 3 to 9 |
| 25 | Sn20—Ag | 0.07 | 69 | Sputtering of alloy having predetermined composition | Ni | 1.0 | 0.9 | 300° C. × 3 sec | 1 to 5 |
| 26 | Sn40—Ag | 0.07 | 64 | Sputtering of alloy having predetermined composition | Ni | 1.0 | 0.9 | 300° C. × 3 sec | 1 to 5 |
| 27 | Sn60—Ag | 0.07 | 60 | Sputtering of alloy having predetermined composition | Ni | 1.0 | 0.9 | 300° C. × 3 sec | 1 to 5 |
| 28 | Sn80—Ag | 0.07 | 55 | Sputtering of alloy having predetermined composition | Ni | 1.0 | 0.9 | 300° C. × 3 sec | 1 to 5 |

*Sn20—Ag means 20 mass % of Sn and 80 mass % of Ag.

TABLE 9

| | | Upper layer | | | | | Lower layer | | | Heat treatment Conditions | Contact resistance [mΩ] | Heat resistance Contact resistance [mΩ] | Solder wettability Zero cross time [sec] |
|---|---|---|---|---|---|---|---|---|---|---|---|---|---|
| | Composition | Thickness [μm] | Deposition amount [μg/cm²] | Relation between thickness and proportion of Sn + In [mass %] | Relation between deposition amount and proportion of Sn + In [mass %] | Formation method | Composition | Thickness [μm] | Deposition amount [mg/cm²] | | | | |
| Examples | 29 Sn20—Ag | 0.03 | 30 | Plating thickness < 0.03 × $e^{0.015 \times (\text{proportion of } Sn + In)}$ | Plating deposition amount < 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 3 to 9 | 2 to 5 |
| | 30 Sn40—Ag | 0.03 | 28 | Plating thickness < 0.03 × $e^{0.015 \times (\text{proportion of } Sn + In)}$ | Plating deposition amount < 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 3 to 9 | 2 to 5 |
| | 31 Sn60—Ag | 0.03 | 43 | Plating thickness < 0.03 × $e^{0.015 \times (\text{proportion of } Sn + In)}$ | Plating deposition amount < 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 3 to 9 | 2 to 5 |
| | 32 Sn80—Ag | 0.10 | 79 | Plating thickness ≥ 0.03 × $e^{0.015 \times (\text{proportion of } Sn + In)}$ | Plating deposition amount < 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 3 to 9 | 2 to 5 |
| | 33 Sn20—Ag | 0.05 | 49 | Plating thickness ≥ 0.03 × $e^{0.015 \times (\text{proportion of } Sn + In)}$ | Plating deposition amount ≥ 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 1 to 5 | 1 to 3 |
| | 34 Sn40—Ag | 0.07 | 64 | Plating thickness ≥ 0.03 × $e^{0.015 \times (\text{proportion of } Sn + In)}$ | Plating deposition amount ≥ 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 1 to 5 | 1 to 3 |
| | 35 Sn60—Ag | 0.12 | 103 | Plating thickness ≥ 0.03 × $e^{0.015 \times (\text{proportion of } Sn + In)}$ | Plating deposition amount ≥ 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 1 to 5 | 1 to 3 |
| | 36 Sn80—Ag | 0.18 | 143 | Plating thickness ≥ 0.03 × $e^{0.015 \times (\text{proportion of } Sn + In)}$ | Plating deposition amount ≥ 27.8 × $e^{0.0017 \times (\text{proportion of } Sn + In)}$ | Sputtering of alloy having predetermined composition | Ni | 1.0 | 0.9 | 300° C. × 3 sec | 1 to 5 | 1 to 5 | 1 to 3 |

*Sn20—Ag means 20 mass % of Sn and 80 mass % of Ag.

TABLE 10

| | | Upper layer | | | | Lower layer | | | | Insertion/extraction force Maximum insertion force/maximum insertion force of Comparative Example 1 [%] | Heat resistance Contact resistance [mΩ] | Solder wettability Zero cross time [sec] |
|---|---|---|---|---|---|---|---|---|---|---|---|---|
| | Composition | Thickness [μm] | Deposition amount [μg/cm²] | Formation method | Composition | Thickness [μm] | Deposition amount [mg/cm²] | Heat treatment Conditions | | | | |
| Examples | 37 Sn60—Ag—As2 | 0.27 | 231 | Sputtering of alloy having predetermined composition | Ni | 1.0 | 0.9 | 300° C. × 3 sec | | 73 | 1 to 4 | 1 to 3 |
| | 38 Sn60—Ag—Au2 | 0.27 | 231 | Sputtering of alloy having predetermined composition | Ni | 1.0 | 0.9 | 300° C. × 3 sec | | 74 | 1 to 4 | 1 to 3 |
| | 39 Sn60—Ag—Bi2 | 0.27 | 231 | Sputtering of alloy having predetermined composition | Ni | 1.0 | 0.9 | 300° C. × 3 sec | | 72 | 1 to 4 | 1 to 3 |
| | 40 Sn60—Ag—Cd2 | 0.27 | 231 | Sputtering of alloy having predetermined composition | Ni | 1.0 | 0.9 | 300° C. × 3 sec | | 71 | 1 to 4 | 1 to 3 |
| | 41 Sn60—Ag—Co2 | 0.27 | 231 | Sputtering of alloy having predetermined composition | Ni | 1.0 | 0.9 | 300° C. × 3 sec | | 74 | 1 to 4 | 1 to 3 |
| | 42 Sn60—Ag—Cr2 | 0.27 | 231 | Sputtering of alloy having predetermined composition | Ni | 1.0 | 0.9 | 300° C. × 3 sec | | 72 | 1 to 4 | 1 to 3 |
| | 43 Sn60—Ag—Cu2 | 0.27 | 231 | Sputtering of alloy having predetermined composition | Ni | 1.0 | 0.9 | 300° C. × 3 sec | | 75 | 1 to 4 | 1 to 3 |
| | 44 Sn60—Ag—Fe2 | 0.27 | 231 | Sputtering of alloy having predetermined composition | Ni | 1.0 | 0.9 | 300° C. × 3 sec | | 73 | 1 to 4 | 1 to 3 |
| | 45 Sn60—Ag—In2 | 0.27 | 231 | Sputtering of alloy having predetermined composition | Ni | 1.0 | 0.9 | 300° C. × 3 sec | | 70 | 1 to 4 | 1 to 3 |
| | 46 Sn60—Ag—Mn2 | 0.27 | 231 | Sputtering of alloy having predetermined composition | Ni | 1.0 | 0.9 | 300° C. × 3 sec | | 76 | 1 to 4 | 1 to 3 |
| | 47 Sn60—Ag—Mo2 | 0.27 | 231 | Sputtering of alloy having predetermined composition | Ni | 1.0 | 0.9 | 300° C. × 3 sec | | 77 | 1 to 4 | 1 to 3 |
| | 48 Sn60—Ag—Ni2 | 0.27 | 231 | Sputtering of alloy having predetermined composition | Ni | 1.0 | 0.9 | 300° C. × 3sec | | 74 | 1 to 4 | 1 to 3 |
| | 49 Sn60—Ag—Pb2 | 0.27 | 231 | Sputtering of alloy having predetermined composition | Ni | 1.0 | 0.9 | 300° C. × 3 sec | | 71 | 1 to 4 | 1 to 3 |
| | 50 SR60—Ag—Sb2 | 0.27 | 231 | Sputtering of alloy having predetermined composition | Ni | 1.0 | 0.9 | 300° C. × 3 sec | | 73 | 1 to 4 | 1 to 3 |
| | 51 Sn60—Ag—W2 | 0.27 | 231 | Sputtering of alloy having predetermined composition | Ni | 1.0 | 0.9 | 300° C. × 3 sec | | 72 | 1 to 4 | 1 to 3 |
| | 52 Sn60—Ag—Zn2 | 0.27 | 231 | Sputtering of alloy having predetermined composition | Ni | 1.0 | 0.9 | 300° C. × 3 sec | | 74 | 1 to 4 | 1 to 3 |
| | 53 Sn60—Ag—Pd2 | 0.27 | 231 | Sputtering of alloy having predetermined composition | Ni | 1.0 | 0.9 | 300° C. × 3 sec | | 71 | 1 to 4 | 1 to 3 |
| | 54 Sn60—Ag—Pt2 | 0.27 | 231 | Sputtering of alloy having predetermined composition | Ni | 1.0 | 0.9 | 300° C. × 3 sec | | 72 | 1 to 4 | 1 to 3 |
| | 55 Sn60—Ag—Rh2 | 0.27 | 231 | Sputtering of alloy having predetermined composition | Ni | 1.0 | 0.9 | 300° C. × 3 sec | | 73 | 1 to 4 | 1 to 3 |
| | 56 Sn60—Ag—Ru2 | 0.27 | 231 | Sputtering of alloy having predetermined composition | Ni | 1.0 | 0.9 | 300° C. × 3 sec | | 75 | 1 to 4 | 1 to 3 |
| | 57 Sn60—Ag—Se2 | 0.27 | 231 | Sputtering of alloy having predetermined composition | Ni | 1.0 | 0.9 | 300° C. × 3 sec | | 77 | 1 to 4 | 1 to 3 |

TABLE 10-continued

| | Upper layer | | | | Lower layer | | | | Insertion/extraction force Maximum insertion force/maximum insertion force of Comparative Example 1 [%] | Heat resistance | | Solder wettability Zero cross time [sec] |
|---|---|---|---|---|---|---|---|---|---|---|---|---|
| | Composition | Thickness [μm] | Deposition amount [μg/cm²] | Formation method | Composition | Thickness [μm] | Deposition amount [mg/cm²] | Heat treatment Conditions | | Contact resistance [mΩ] | | |
| 58 | Sn60—Ag—Ir2 | 0.27 | 231 | Sputtering of alloy having predetermined composition | Ni | 1.0 | 0.9 | 300° C. × 3 sec | 73 | 1 to 4 | | 1 to 3 |
| 59 | Sn60—Ag | 0.27 | 231 | Sputtering of alloy having predetermined composition | Cr | 1.0 | 0.9 | 300° C. × 3 sec | 69 | 1 to 4 | | 1 to 3 |
| 60 | Sn60—Ag | 0.27 | 231 | Sputtering of alloy having predetermined composition | Mn | 1.0 | 0.9 | 300° C. × 3 sec | 76 | 1 to 4 | | 1 to 3 |
| 61 | Sn60—Ag | 0.27 | 231 | Sputtering of alloy having predetermined composition | Fe | 1.0 | 0.9 | 300° C. × 3 sec | 73 | 1 to 4 | | 1 to 3 |
| 62 | Sn60—Ag | 0.27 | 231 | Sputtering of alloy having predetermined composition | Co | 1.0 | 0.9 | 300° C. × 3 sec | 71 | 1 to 4 | | 1 to 3 |
| 63 | Sn60—Ag | 0.27 | 231 | Sputtering of alloy having predetermined composition | Cu | 1.0 | 0.9 | 300° C. × 3 sec | 75 | 1 to 4 | | 1 to 3 |
| 64 | Sn60—Ag | 0.27 | 231 | Sputtering of alloy having predetermined composition | Ni—20Cr | 1.0 | 0.9 | 300° C. × 3 sec | 67 | 1 to 4 | | 1 to 3 |
| 65 | Sn60—Ag | 0.27 | 231 | Sputtering of alloy having predetermined composition | Ni—20Mn | 1.0 | 0.9 | 300° C. × 3 sec | 75 | 1 to 4 | | 1 to 3 |
| 66 | Sn60—Ag | 0.27 | 231 | Sputtering of alloy having predetermined composition | Ni—20Fe | 1.0 | 0.9 | 300° C. × 3 sec | 73 | 1 to 4 | | 1 to 3 |
| 67 | Sn60—Ag | 0.27 | 231 | Sputtering of alloy having predetermined composition | Ni—20Co | 1.0 | 0.9 | 300° C. × 3 sec | 69 | 1 to 4 | | 1 to 3 |
| 68 | Sn60—Ag | 0.27 | 231 | Sputtering of alloy having predetermined composition | Ni—20Cu | 1.0 | 0.9 | 300° C. × 3 sec | 73 | 1 to 4 | | 1 to 3 |
| 69 | Sn60—Ag | 0.27 | 231 | Sputtering of alloy having predetermined composition | Ni—2B | 1.0 | 0.9 | 300° C. × 3 sec | 62 | 1 to 4 | | 1 to 3 |
| 70 | Sn60—Ag | 0.27 | 231 | Sputtering of alloy having predetermined composition | Ni—2P | 1.0 | 0.9 | 300° C. × 3 sec | 62 | 1 to 4 | | 1 to 3 |
| 71 | Sn60—Ag | 0.27 | 231 | Sputtering of alloy having predetermined composition | Ni—10Sn | 1.0 | 0.9 | 300° C. × 3 sec | 71 | 1 to 4 | | 1 to 3 |
| 72 | Sn60—Ag | 0.27 | 231 | Sputtering of alloy having predetermined composition | Ni—10Zn | 1.0 | 0.9 | 300° C. × 3 sec | 73 | 1 to 4 | | 1 to 3 |

*Sn60—Ag—As2 means 60 mass % of Sn, 38 mass % of Ag and 2 mass % of As.

TABLE 11

| | | Upper layer | | | | Lower layer | | | Heat treatment Conditions | Vickers hardness Hv | Indentation hardness [MPa] | Insertion/extraction force Maximum insertion force/maximum insertion force of Comparative Example 1 [%] | Bending processability |
|---|---|---|---|---|---|---|---|---|---|---|---|---|---|
| | | Composition | Thickness [μm] | Deposition amount [μg/cm²] | Formation method | Composition | Thickness [μm] | Deposition amount [μg/cm²] | | | | | |
| Examples | 73 | Sn26—Ag | 0.15 | 145 | 0.1-μm Ag plating followed by 0.05-μm Sn plating on Ag | Ni | 1.0 | 0.9 | None | 130 | 1500 | 79 | ○ |
| | 74 | Sn26—Ag | 0.15 | 145 | 0.1-μm Ag plating followed by 0.05-μm Sn plating on Ag | Ni (semi-glossy) | 1.0 | 0.9 | None | 300 | 3400 | 75 | ○ |
| | 75 | Sn26—Ag | 0.15 | 145 | 0.1-μm Ag plating followed by 0.05-μm Sn plating on Ag | Ni (glossy) | 1.0 | 0.9 | None | 600 | 6700 | 69 | ○ |
| | 76 | Sn26—Ag | 0.15 | 145 | 0.1-μm Ag plating followed by 0.05-μm Sn plating on Ag | Ni—2P | 1.0 | 0.9 | None | 1200 | 13000 | 63 | x |

*Sn26—Ag means 26 mass % of Sn and 74 mass % of Ag.

TABLE 12

| | | Upper layer | | | | Lower layer | | | Heat treatment Conditions | Evaluations from outermost layer | | | |
|---|---|---|---|---|---|---|---|---|---|---|---|---|---|
| | | | | | | | | | | Arithmetic mean height Ra [μm] | Maximum height Rz [μm] | Reflection density | Gas corrosion resistance |
| | | Composition | Thickness [μm] | Deposition amount [μg/cm²] | Formation method | Composition | Thickness [μm] | Deposition amount [mg/cm²] | | | | | |
| Examples | 77 | Sn26—Ag | 0.15 | 145 | 0.1-μm Ag plating (Dk = 0.5) followed by 0.05-μm Sn plating (Dk = 0.5) on Ag | Ni | 1.0 | 0.9 | None | 0.12 | 1.25 | 0.2 | Somewhat discolored in small areas |
| | 78 | Sn26—Ag | 0.15 | 145 | 0.1-μm Ag plating (Dk = 4) followed by 0.05-μm Sn plating (Dk = 0.5) on Ag | Ni | 1.0 | 0.9 | None | 0.087 | 0.75 | 0.3 | Not discolored |
| | 79 | Sn26—Ag | 0.15 | 145 | 0.1-μm Ag plating (Dk = 0.5) followed by 0.05-μm Sn plating (Dk = 4) on Ag | Ni | 1.0 | 0.9 | None | 0.075 | 0.55 | 0.7 | Not discolored |

TABLE 12-continued

| | Upper layer | | | | Lower layer | | | Heat treatment Conditions | Evaluations from outermost layer | | | |
| | | | | | | | | | Arithmetic mean height Ra [μm] | Maximum height Rz [μm] | Reflection density | Gas corrosion resistance |
| Composition | Thickness [μm] | Deposition amount [μg/cm²] | Formation method | Composition | Thickness [μm] | Deposition amount [mg/cm²] | | | | | | |
| --- | --- | --- | --- | --- | --- | --- | --- | --- | --- | --- | --- | --- |
| 80 Sn26—Ag | 0.15 | 145 | 0.1-μm Ag plating (Dk = 4) followed by 0.05-μm Sn plating (Dk = 4) on Ag | Ni | 1.0 | 0.9 | None | 0.045 | 0.35 | 0.9 | Not discolored |

*Sn26—Ag means 26 mass % of Sn and 74 mass % of Ag.

TABLE 13

| | | Upper layer | | | Lower layer | | | | | XPS (Depth) | | | | | Insertion/extraction force Maximum insertion force/maximum insertion force of Comparative Example 1 [%] | Heat resistance Contact resistance [mΩ] | Gas corrosion resistance |
|---|---|---|---|---|---|---|---|---|---|---|---|---|---|---|---|---|---|
| | Composition | Thickness [μm] | Deposition amount [μg/cm²] | Formation method | Composition | Thickness [μm] | Deposition amount [mg/cm²] | Heat treatment Conditions | Order of $D_1$, $D_2$ and $D_3$ | $D_1$ [at %] | $D_2$ [at %] | $D_3$ Thickness of 25 at % or more [nm] | | | | | |
| Examples | 81 Sn41—Ag | 0.06 | 55 | 0.03-μm Ag plating followed by 0.03-μm Sn plating on Ag | Ni | 1.0 | 0.9 | None | $D_1 \gg D_2 \gg D_3$ | 35 | 35 | 100< | 72 | 1 to 4 | No discolored |
| | 82 Sn41—Ag | 0.06 | 55 | 0.03-μm Ag plating followed by 0.03-μm Sn plating on Ag | Ni | 0.1 | 0.1 | None | $D_1 \gg D_2 \gg D_3$ | 87 | 87 | 80 | 80 | 1 to 4 | No discolored |
| Comparative Examples | 17 Sn41—Ag | 0.06 | 55 | 0.03-μm Ag plating followed by 0.03-μm Sn plating on Ag | Ni | 0.01 | 0.01 | None | $D_1 \gg D_2 \gg D_3$ | 87 | 87 | 25 | 87 | | |
| | 18 Sn41—Ag | 0.06 | 55 | 0.03-μm Ag plating followed by 0.03-μm Sn plating on Ag | Ni | 1.0 | 0.89 | None | $D_2 \gg D_1 \gg D_3$ | | | | | | Discolored |
| | 19 Sn | 0.002 | 1.5 | Sn plating | Ni | 1.0 | 0.89 | None | $D_1 \gg D_3$ | 12 | <10 | 100< | | 10< | |
| | 20 Sn41—Ag | 0.002 | 1.5 | 0.001-μm Ag plating followed by 0.03-μm Sn plating on Ag | Ni | 1.0 | 0.89 | None | $D_1 \gg D_2 \gg D_3$ | <10 | 14 | 100< | | | Discolored |

*Sn41—Ag means 41 mass % of Sn and 59 mass % of Ag.

TABLE 14

| | | Upper layer | | | | Lower layer | | | | | Insertion/extraction force Maximum insertion force/maximum insertion force of Comparative Example 1 [%] | Bending processability |
|---|---|---|---|---|---|---|---|---|---|---|---|---|
| | | Composition | Thickness [μm] | Deposition amount [μg/cm²] | Formation method | Composition | Thickness [μm] | Deposition amount [mg/cm²] | Vickers hardness Hv | Indentation hardness [MPa] | Heat treatment Conditions | | |
| Examples | 83 | Sn26—Ag | 0.15 | 145 | 0.1-μm Ag plating followed by 0.05-μm Sn plating on Ag | Ni | 1.0 | 0.9 | 130 | 1500 | None | 79 | ○ |
| | 84 | Sn26—Ag | 0.15 | 145 | 0.1-μm Ag plating followed by 0.05-μm Sn plating on Ag | Ni (semi-glossy) | 1.0 | 0.9 | 300 | 3400 | None | 75 | ○ |
| | 85 | Sn26—Ag | 0.15 | 145 | 0.1-μm Ag plating followed by 0.05-μm Sn plating on Ag | Ni (glossy) | 1.0 | 0.9 | 600 | 6700 | None | 69 | ○ |
| | 86 | Sn26—Ag | 0.15 | 145 | 0.1-μm Ag plating followed by 0.05-μm Sn plating on As | Ni—P | 1.0 | 0.9 | 1200 | 13000 | None | 63 | x |

*Sn26—Ag means 26 mass % of Sn and 74 mass % of Ag.

TABLE 15

| | | Upper layer | | | | Lower layer | | | Heat treatment Conditions | XPS Constituent elements A/(constituent elements A + constituent elements B) in the range of 0.02 μm from outermost surface | Gas corrosion resistance | |
|---|---|---|---|---|---|---|---|---|---|---|---|---|
| | | Composition | Thickness [μm] | Deposition amount [μg/cm²] | Formation method | Composition | Thickness [μm] | Deposition amount [mg/cm²] | | | Exterior appearance after test | Contact resistance after test |
| Examples | 87 | Sn15—Ag | 0.30 | 275 | Sputtering of alloy having predetermined composition | Ni | 1.0 | 0.9 | 300° C. × 3 sec | 0.13< | No discolored | 4 to 8 |
| | 88 | Sn40—Ag | 0.27 | 248 | Sputtering of alloy having predetermined composition | Ni | 1.0 | 0.9 | 300° C. × 3 sec | 0.18< | No discolored | 2 to 5 |
| | 89 | Sn60—Ag | 0.27 | 248 | Sputtering of alloy having predetermined composition | Ni | 1.0 | 0.9 | 300° C. × 3 sec | 0.20< | No discolored | 2 to 5 |
| Comparative Examples | 21 | Sn8—Ag | 0.56 | 514 | 0.5-μm Ag plating followed by 0.06-μm Sn plating on Ag | Ni | 1.0 | 0.9 | 500° C. × 18 sec | <0.1 | Discolored | 10< |
| | 22 | Sn3—Ag | 1.05 | 964 | 1.0-μm Ag plating followed by | Ni | 1.0 | 0.9 | 600° C. × 30 sec | <0.1 | Discolored | 10< |

TABLE 15-continued

| | Upper layer | | | Lower layer | | Heat treatment Conditions | XPS Constituent elements A/(constituent elements A + constituent elements B) in the range of 0.02 μm from outermost surface | Gas corrosion resistance | |
|---|---|---|---|---|---|---|---|---|---|
| Composition | Thickness [μm] | Deposition amount [μg/cm²] | Formation method | Composition | Thickness [μm] | Deposition amount [mg/cm²] | | Exterior appearance after test | Contact resistance after test |
| | | 0.05-μm Sn plating on Ag | | | | | | | |

*Sn15—Ag means 15 mass % of Sn and 85 mass % of Ag.

Examples 1 to 89 were each a metallic material for electronic components excellent in any of the low degree of insertion/extraction force, the low degree of whisker formation and the high durability.

Comparative Example 1 is a blank material.

In Comparative Example 2, the preparation thereof was performed by making thinner the Sn plating of the blank material of Comparative Example 1, but the whiskers of 20 μm or more in length occurred. In Comparative Example 2, the fine sliding wear resistance was poor and the contact resistance was increased.

In Comparative Example 3, the preparation thereof was performed without applying heat treatment, as compared with Comparative Example 2, but the whiskers of 20 μm or more in length occurred. In Comparative Example 3, the fine sliding wear resistance was poor and the contact resistance was increased.

In Comparative Example 4, the preparation thereof was performed by applying Cu plating to the lower layer, as compared with Comparative Example 1, but the whiskers of 20 μm or more in length occurred. In Comparative Example 4, the fine sliding wear resistance was poor and the contact resistance was increased.

In Comparative Example 5, the preparation thereof was performed by applying a thicker Ni plating of the lower layer as compared with the blank material of Comparative Example 1, but the properties were not different from those of Comparative Example 1.

In Comparative Example 6, the proportion of Sn+In in the upper layer was 10 mass % or less, and hence the gas corrosion resistance was poor.

In Comparative Example 7, the gas corrosion resistance was poor as it was the case in Comparative Example 6.

In Comparative Example 8, the plating thickness was thicker than $8.2 \times (\text{proportion of Sn+In})^{-0.66}$ and hence the insertion/extraction force was higher than the intended target, and the whiskers of 20 μm or more in length occurred.

In Comparative Example 9, the plating was not applied to the lower layer, and hence the insertion force was higher than the intended target.

In Comparative Example 10, no plating was applied to the upper layer, and hence the fine sliding wear resistance was poor, the contact resistance was increased, and the gas corrosion resistance was also poor.

In Comparative Example 11, the plating of the lower layer was extremely thin, and hence the insertion/extraction force was higher than the intended target.

In Comparative Example 12, the plating of the upper layer was extremely thin, and hence the fine sliding wear resistance was poor, the contact resistance was increased, and the gas corrosion resistance was also poor.

In Comparative Example 13, the plating thickness of the upper layer exceeds 0.6 μm, the plating thickness was thicker than $8.2 \times (\text{proportion of Sn+In})^{-0.66}$, and hence the whiskers of 20 μm or more occurred and the insertion/extraction force was higher than the intended target.

In Comparative Example 14, the plating thickness of the upper layer exceeds 0.6 μm, the plating thickness was thicker than $8.2 \times (\text{proportion of Sn+In})^{-0.66}$ and hence the whiskers of 20 μm or more occurred and the insertion/extraction force was higher than the intended target.

In Comparative Example 15, the plating thickness of the upper layer was thicker than $8.2 \times (\text{proportion of Sn+In})^{-0.66}$ and the whiskers of 20 μm or more occurred, the insertion/extraction force was higher than the intended target, and the contact resistance after the fine sliding wear resistance test was high.

In Comparative Example 16, the plating thickness of the upper layer was thicker than $8.2 \times (\text{proportion of Sn+In})^{-0.66}$, and the whiskers of 20 μm or more occurred, the insertion/extraction force was higher than the intended target, and the contact resistance after the fine sliding wear resistance test was high.

In Comparative Example 17, the plating of the lower layer was extremely thin, accordingly the depth at which the atomic concentration (at %) of Ni, Cr, Mn, Fe, Co or Cu in the lower layer as measured by the depth measurement with XPS (X-ray photoelectron spectroscopy) was 25 at % or more was thinner than the intended target, and hence the insertion/extraction force was higher than the intended target.

In Comparative Example 18, the order of the Sn plating and the Ag plating was reversed in the production of Comparative Example 18 as compared with Example 17; the position ($D_1$) indicating the highest value of the atomic concentration (at %) of Sn or In of the constituent elements A of the upper layer and the position ($D_2$) indicating the highest value of the concentration (at %) of Ag, Au, Pt, Pd, Ru, Rh, Os or Ir of the constituent elements B of the upper layer, as measured by the depth measurement with XPS (X-ray photoelectron spectroscopy), were located in the order of $D_2$ and $D_1$, and hence the gas corrosion resistance was poor.

In Comparative Example 19, no constituent elements B were present in the upper layer, the highest value of the atomic concentration (at %) of Ag, Au, Pt, Pd, Ru, Rh, Os or Ir of the constituent elements B of the upper layer was equal to or lower than the intended target, and hence the heat resistance was poor.

In Comparative Example 20, the preparation thereof was performed by making the Sn plating of the upper layer extremely thin; on the basis of a depth measurement performed by XPS (X-ray photoelectron spectroscopy), the atomic concentration at the position ($D_1$) indicating the highest value of the atomic concentration (at %) of Sn or In of the upper layer was 10 at % or less, and the gas corrosion resistance was poor.

In Comparative Example 21, the proportion of Sn+In in the upper layer was 10 mass % or less, and on the basis of a depth measurement performed by XPS (X-ray photoelectron spectroscopy), in the range of 0.02 μm from the outermost surface, the atomic concentration (at %) ratio, the constituent elements A [at %]/(the constituent elements A+the constituent elements B)[at %] was less than 0.1; thus, the proportion of the constituent element(s) A was extremely small, $Ag_3Sn$ was not present, and no Ag phase was present, and hence the gas corrosion resistance was poor.

In Comparative Example 22, the gas corrosion resistance was poor for the same reason as in Comparative Example 21.

Figure 2:
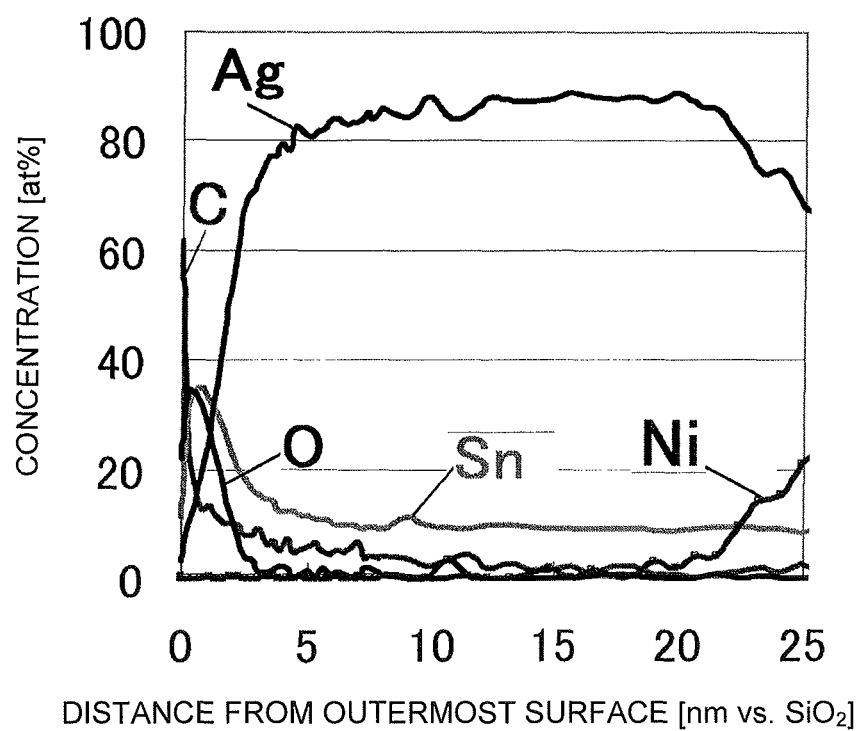
FIG. 2 shows the results of the depth measurement by XPS (X-ray photoelectron spectroscopy) according to Example 17.

FIG. 2 shows the results of a depth measurement with XPS (X-ray photoelectron spectroscopy) according to Example 17. As can be seen from FIG. 2, the position ($D_1$) indicating the highest value of the atomic concentration (at %) of Sn or In in the upper layer and the position ($D_2$) indicating the highest value of the atomic concentration (at %) of Ag, Au, Pt, Pd, Ru, Rh, Os or Ir in the upper layer were located in the order of $D_1$ and $D_2$, and the atomic concentration at $D_1$ was 35 at % and the atomic concentration at $D_2$ was 87 at %. As can also be seen from FIG. 2, the atomic concentration (at %) ratio, the constituent elements A/(the constituent elements A+the constituent elements B), in the range of 0.02 μm from the outermost surface, is 0.1 or more. Specifically, in this range, the lowest concentration of the constituent element A (Sn) was 10 at %, and the corresponding concentration of the constituent element B (Ag) was 90 at %, the ratio of the constituent element A/(constituent element A+constituent element B) was 0.1.

REFERENCE SIGNS LIST

10 Metallic material for electronic components
11 Base material
12 Lower layer
13 Upper layer

The invention claimed is:

1. A metallic material for electronic components excellent in low degree of whisker formation, low degree of insertion/extraction force, fine sliding wear resistance and gas corrosion resistance, comprising:
a base material;
on the base material, a lower layer constituted with one or two or more selected from the group consisting of Ni, Cr, Mn, Fe, Co and Cu; and
on the lower layer, an upper layer constituted with an alloy of one or both of Sn and In (constituent elements A) and one or two or more selected from Ag, Au, Pt, Pd, Ru, Rh, Os and Ir (constituent elements B),
wherein the thickness of the lower layer is 0.05 μm or more;
the thickness of the upper layer is 0.005 μm or more and 0.6 μm or less; and
in the upper layer, the relation between the constituent element(s) A/(the constituent element(s) A+the constituent element(s) B) [mass %] (hereinafter, referred to as the proportion of Sn+In) and the plating thickness [μm] is given by plating thickness≤8.2×(proportion of Sn+In)$^{-0.66}$
[here, (proportion of Sn+In)≥10 mass %].

2. A metallic material for electronic components excellent in low degree of whisker formation, low degree of insertion/extraction force, fine sliding wear resistance and gas corrosion resistance, comprising:
a base material;
on the base material, a lower layer constituted with one or two or more selected from the group consisting of Ni, Cr, Mn, Fe, Co and Cu; and
on the lower layer, an upper layer constituted with an alloy of one or both of Sn and In (constituent elements A) and one or two or more selected from Ag, Au, Pt, Pd, Ru, Rh, Os and Ir (constituent elements B),
wherein the plating deposition amount of the lower layer is 0.03 mg/cm$^2$ or more;
the plating deposition amount of the upper layer is 7 μg/cm$^2$ or more and 600 μg/cm$^2$ or less; and
in the upper layer, the relation between the constituent element(s) A/(the constituent element(s) A+the constituent element(s) B) [mass %] (hereinafter, referred to as the proportion of Sn+In) and the plating deposition amount [μg/cm$^2$] is given by plating deposition amount≤8200×(proportion of Sn+In)$^{-0.66}$ [here, (proportion of Sn+In)≥10 mass %].

3. The metallic material for electronic components excellent in insertion-extraction resistance, according to claim 1 or 2, wherein the plating thickness of the upper layer is 0.05 μm or more.

4. The metallic material for electronic components excellent in insertion-extraction resistance, according to claim 1 or 2, wherein the plating deposition amount of the upper layer is 40 μg/cm$^2$ or more.

5. The metallic material for electronic components excellent in heat resistance and solder wettability, according to claim 1 or 2,
wherein the relation between the proportion of Sn+In [mass %] and the plating thickness [μm] of the upper layer is given by plating thickness≥0.03×$e^{0.015 \times (proportion\ of\ Sn+In)}$.

6. The metallic material for electronic components excellent in heat resistance and solder wettability, according to claim 1 or 2, wherein the relation between the proportion of Sn+In [mass %] and the plating deposition amount [μg/cm$^2$] of the upper layer is given by plating deposition amount≥27.8×$e^{0.017 \times (proportion\ of\ Sn+In)}$.

7. The metallic material for electronic components according to claim 1 or 2, wherein the upper layer is formed by the diffusion of the constituent element(s) A and the constituent element(s) B under the conditions that a film of the constituent element(s) B is formed and then a film of the constituent element(s) A is formed on the lower layer.

8. The metallic material for electronic components according to claim 7, wherein the diffusion is performed by heat treatment.

9. The metallic material for electronic components according to claim 1 or 2, wherein the constituent elements A in the upper layer is 50 mass % or more in terms of the total content of Sn and In, and the upper layer further includes one or two or more metals selected from the group consisting of As, Bi, Cd, Co, Cr, Cu, Fe, Mn, Mo, Ni, Pb, Sb, W and Zn, as the alloy components.

10. The metallic material for electronic components according to claim 1 or 2, wherein the constituent elements B in the upper layer is 50 mass % or more in terms of the total content of Ag, Au, Pt, Pd, Ru, Rh, Os and Ir, and the upper layer further includes one or two or more metals selected from the group consisting of Bi, Cd, Co, Cu, Fe, In, Mn, Mo, Ni, Pb, Sb, Se, Sn, W, Tl and Zn, as the alloy components.

11. The metallic material for electronic components according to claim 1 or 2, wherein the alloy composition of the lower layer comprises Ni, Cr, Mn, Fe, Co and Cu in the total amount of these of 50 mass % or more, and further comprises one or two or more selected from the group consisting of B, P, Sn and Zn.

12. The metallic material for electronic components according to claim 1 or 2, wherein the indentation hardness measured from the surface of the upper layer is 1000 MPa or more.

13. The metallic material for electronic components, having high bending processability, according to claim 1 or 2, wherein the indentation hardness measured from the surface of the upper layer is 10000 MPa or less.

14. The metallic material for electronic components according to claim 1 or 2, wherein on the basis of a depth analysis performed by XPS (X-ray photoelectron spectroscopy), the position ($D_1$) indicating the highest value of the atomic concentration (at %) of Sn or In of the constituent elements A of the upper layer, the position ($D_2$) indicating the highest value of the concentration (at %) of Ag, Au, Pt, Pd, Ru, Rh, Os or Ir of the constituent elements B of the upper layer, and the position ($D_3$) indicating the highest value of the atomic concentration (at %) of Ni, Cr, Mn, Fe, Co or Cu of the lower layer are located in the order of $D_1$, $D_2$ and $D_3$ from the outermost surface.

15. A connector terminal using, in the contact portion thereof, the metallic material for electronic components according to claim 1 or 2.

16. An FFC terminal using, in the contact portion thereof, the metallic material for electronic components according to claim 1 or 2.

17. An FPC terminal using, in the contact portion thereof, the metallic material for electronic components according to claim 1 or 2.

18. An electronic component using, in the electrode thereof for external connection, the metallic material for electronic components according to claim 1 or 2.

19. An electronic component using the metallic material for electronic components according to claim 1 or 2, in a push-in type terminal thereof for fixing a board connection portion to a board by pushing the board connection portion into the through hole formed in the board, wherein a female terminal connection portion and the board connection portion are provided respectively on one side and the other side of a mounting portion to be attached to a housing.

* * * * *